US012812841B2

(12) United States Patent
Park et al.

(10) Patent No.: US 12,812,841 B2
(45) Date of Patent: Nov. 24, 2026

(54) SEMICONDUCTOR MEMORY DEVICES AND METHODS FOR MANUFACTURING THE SAME

(71) Applicant: Samsung Electronics Co., Ltd., Suwon-si (KR)

(72) Inventors: Tae Jin Park, Suwon-si (KR); Jun Soo Kim, Suwon-si (KR); Ji Ho Park, Suwon-si (KR); Ki Seok Lee, Suwon-si (KR); Myeong-Dong Lee, Suwon-si (KR); Ho Sang Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 338 days.

(21) Appl. No.: 18/507,204

(22) Filed: Nov. 13, 2023

(65) Prior Publication Data

US 2024/0365532 A1 Oct. 31, 2024

(30) Foreign Application Priority Data

Apr. 26, 2023 (KR) ........................ 10-2023-0054633

(51) Int. Cl.
*H10B 12/00* (2023.01)

(52) U.S. Cl.
CPC ........... *H10B 12/34* (2023.02); *H10B 12/053* (2023.02); *H10B 12/315* (2023.02)

(58) Field of Classification Search
CPC .... H10B 12/34; H10B 12/053; H10B 12/315; H10B 12/033; H10B 12/482; H10B 12/488
See application file for complete search history.

(56) References Cited

U.S. PATENT DOCUMENTS

| | | | |
|---|---|---|---|
| 8,835,257 B2 | 9/2014 | Kim et al. | |
| 2020/0381436 A1 | 12/2020 | Noh et al. | |
| 2021/0183689 A1 | 6/2021 | Kang et al. | |
| 2022/0077154 A1* | 3/2022 | Kim | H10B 12/34 |
| 2022/0115377 A1* | 4/2022 | Kim | H10D 64/513 |

FOREIGN PATENT DOCUMENTS

| | | |
|---|---|---|
| KR | 10-2020-0057289 A | 5/2020 |
| KR | 10-2020-0061871 A | 6/2020 |

* cited by examiner

*Primary Examiner* — Mohammed R Alam
(74) *Attorney, Agent, or Firm* — Wolf, Greenfield & Sacks, P.C.

(57) ABSTRACT

Semiconductor memory devices including capacitors and methods for manufacturing thereof. The semiconductor memory device may include a substrate, an element isolation pattern defining an active area in the substrate, a first conductive pattern on the substrate and the element isolation pattern, and extending in a first direction, wherein the first conductive pattern is connected to a first portion of the active area, a capacitor structure on the substrate and the element isolation pattern and connected to a second portion of the active area, a gate trench defined in the substrate and the element isolation pattern and extending in a second direction, wherein a first trench width of a portion of the gate trench in the active area is greater than a second trench width of a portion of the gate trench in the element isolation pattern.

20 Claims, 33 Drawing Sheets

SEMICONDUCTOR MEMORY DEVICES AND METHODS FOR MANUFACTURING THE SAME

CROSS-REFERENCE TO RELATED APPLICATION

This application claims priority and the benefits accruing under 35 U.S.C. § 119 from Korean Patent Application No. 10-2023-0054633, filed on Apr. 26, 2023, in the Korean Intellectual Property Office, and the entire contents of the above-identified application are herein incorporated by reference.

TECHNICAL FIELD

The present disclosure relates to semiconductor memory devices and methods for manufacturing the same. More specifically, the present disclosure relates to semiconductor memory devices including capacitors and to methods for manufacturing the same.

BACKGROUND

As a semiconductor memory device become increasingly highly integrated, individual circuit patterns are becoming more miniaturized to implement a larger number of semiconductor memory devices in the same area. However, the miniaturization of individual circuit patterns increases process difficulty and causes defects.

SUMMARY

One technical purpose to be achieved by the present disclosure is to provide a semiconductor memory device with improved integration.

Another technical purpose to be achieved by the present disclosure is to provide a method for manufacturing a semiconductor memory device with improved integration.

The present disclosure is not limited to the above-mentioned purposes. Purposes and advantages according to the present disclosure that are not explicitly mentioned herein may be understood based on following descriptions, and may be more clearly understood based on some examples of embodiments of the present inventive concepts. Further, it will be easily understood that the purposes and advantages according to the present disclosure may be realized using various combinations of components or operations that are provided herein.

According to some aspects of the present disclosure, there is provided a semiconductor memory device comprising a substrate, an element isolation pattern defining an active area in the substrate, a first conductive pattern on the substrate and the element isolation pattern, and extending in a first direction, wherein the first conductive pattern is connected to a first portion of the active area, a capacitor structure on the substrate and the element isolation pattern and connected to a second portion of the active area, a gate trench defined in the substrate and the element isolation pattern and extending in a second direction that intersects the first direction, the gate trench extending across the active area in an area between the first portion and the second portion thereof and a second conductive pattern disposed in the gate trench and extending in the second direction, wherein a first trench width of a portion of the gate trench in the active area is greater than a second trench width of a portion of the gate trench in the element isolation pattern.

According to some aspects of the present disclosure, there is provided a semiconductor memory device comprising a substrate, an element isolation pattern defining an active area in the substrate, a first conductive pattern on the substrate and the element isolation pattern, and extending in a first direction, wherein the first conductive pattern is connected to a first portion of the active area, a capacitor structure on the substrate and the element isolation pattern, the capacitor structure connected to a second portion of the active area, a gate trench defined in the substrate and the element isolation pattern and extending in a second direction intersecting the first direction, wherein the gate trench extends across the active area in an area between the first portion and the second portion thereof, and a second conductive pattern in the gate trench and extending in the second direction. The area between the first portion and the second portion of the active area may include a lower pattern covered with the element isolation pattern, and an upper pattern on the lower pattern and free from coverage by the element isolation pattern, a first pattern width of the upper pattern may be smaller than a second pattern width of the lower pattern, and a portion of the upper pattern adjacent to the first portion and the second portion may overlap the element isolation pattern in the second direction.

According to some aspects of the present disclosure, there is provided a semiconductor memory device comprising a substrate, an element isolation pattern defining an active area in the substrate, a first conductive pattern on the substrate and the element isolation pattern and extending in a first direction, a direct contact connecting the active area and the first conductive pattern to each other, a spacer structure extending along a side surface of the first conductive pattern, a buried contact on a side surface of the spacer structure and connected to the active area, a capacitor structure on the buried contact and connected to the buried contact, and a gate trench defined in the substrate and the element isolation pattern and extending in a second direction that intersects the first direction. The gate trench may extend across the active area in an area between the direct contact and the buried contact, a second conductive pattern may be in the gate trench and may extend in the second direction, and a first width of a portion of the gate trench in the active area may be greater than a second width of a portion of the gate trench in the element isolation pattern.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

Hereinafter, a semiconductor memory device according to some embodiments is described with reference to FIGS. 1 to 8.

Figure 1:
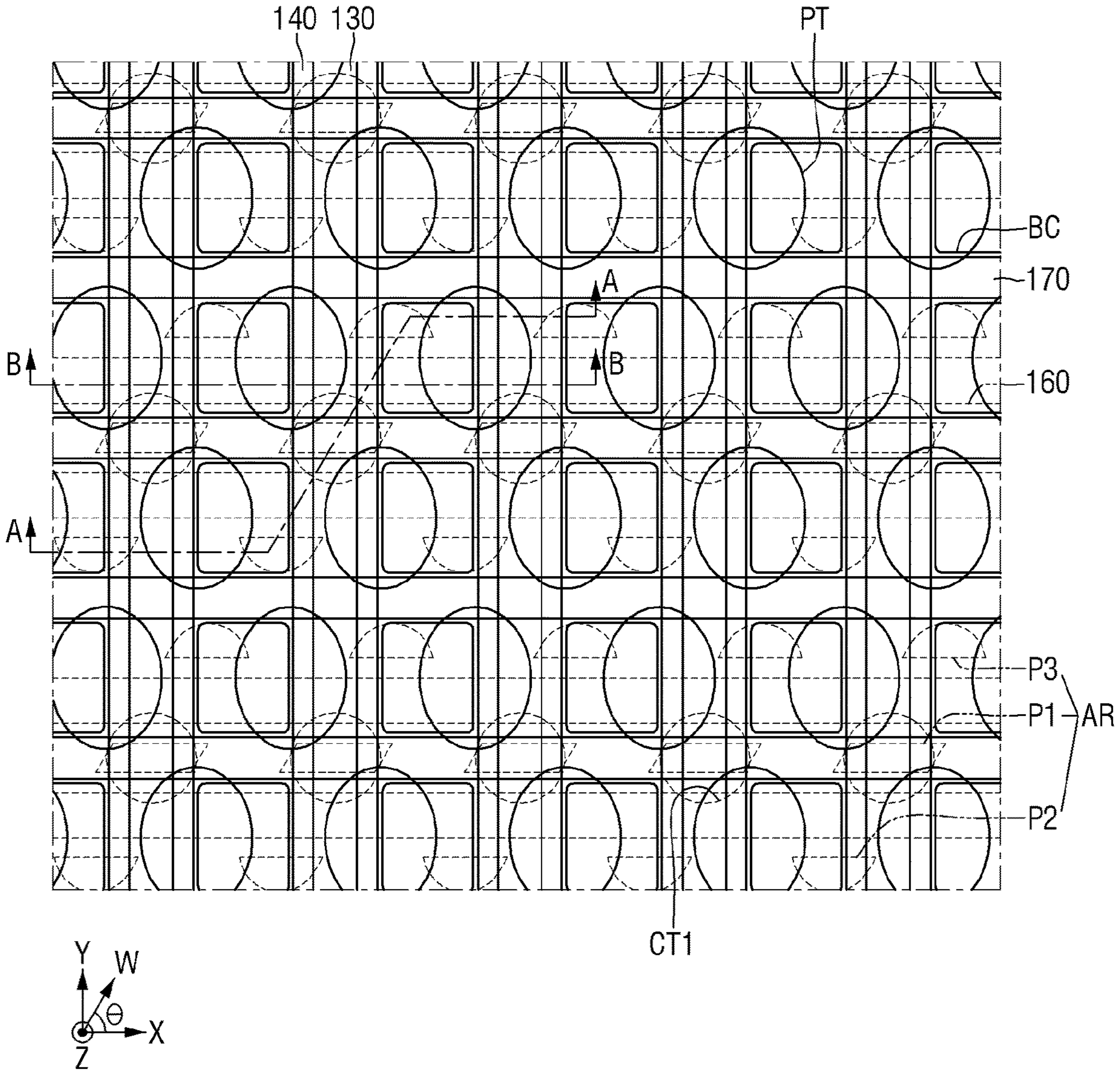
FIG. 1 is a layout diagram for illustrating a semiconductor memory device according to some embodiments.
Figure 2:
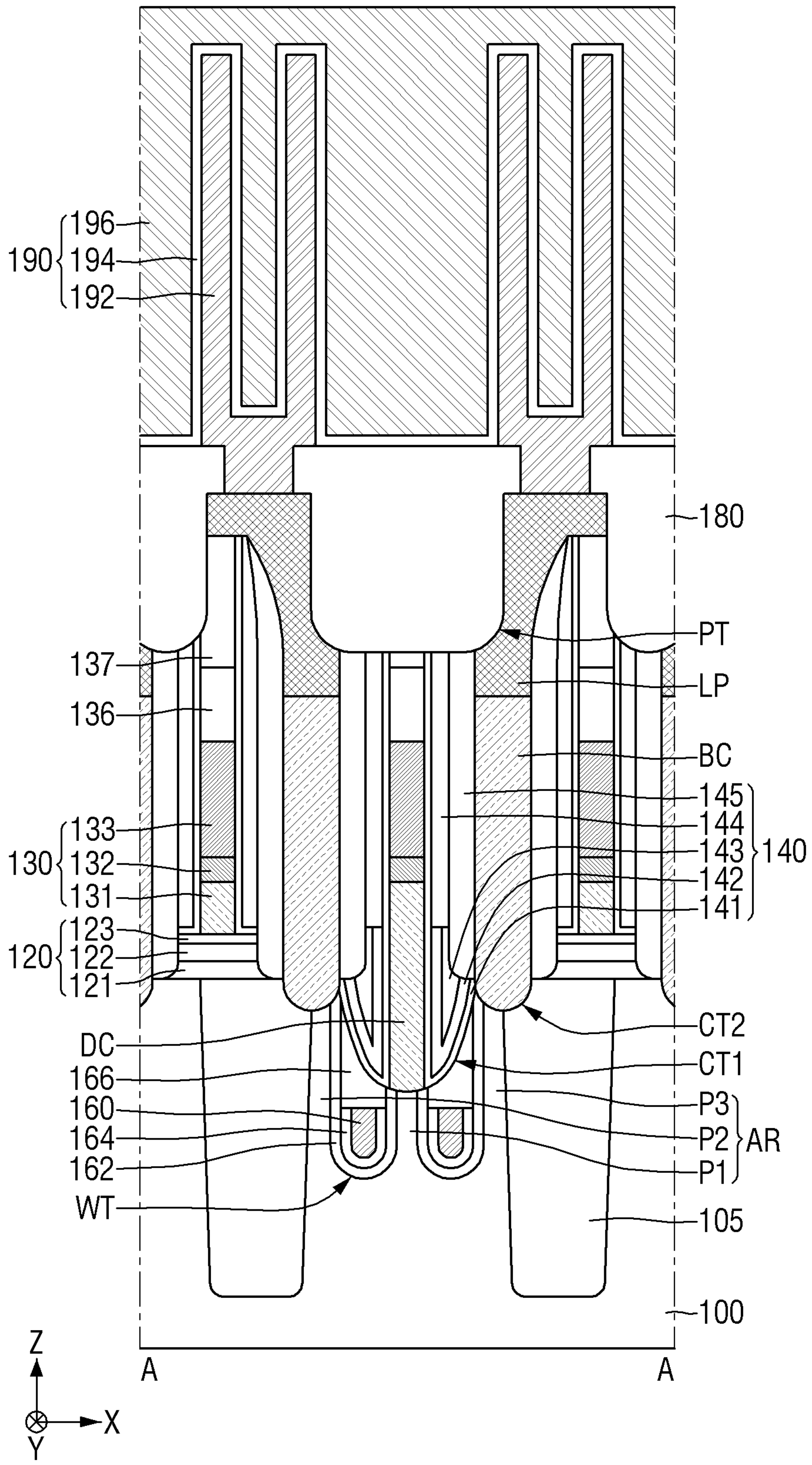
FIG. 2 is a cross-sectional view taken along a line A-A of FIG. 1.
Figure 3:
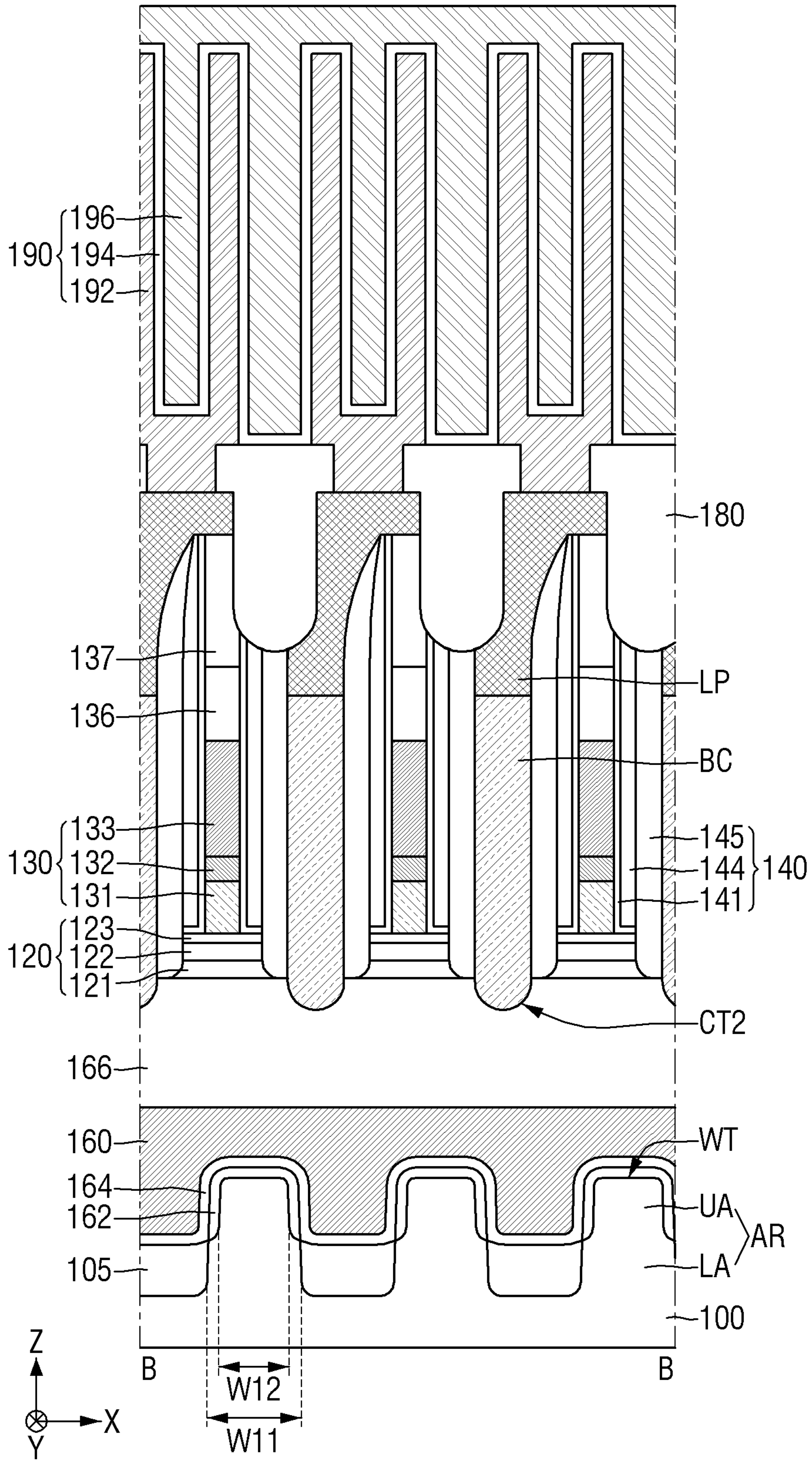
FIG. 3 is a cross-sectional view taken along a line B-B of FIG. 1.
Figure 4:
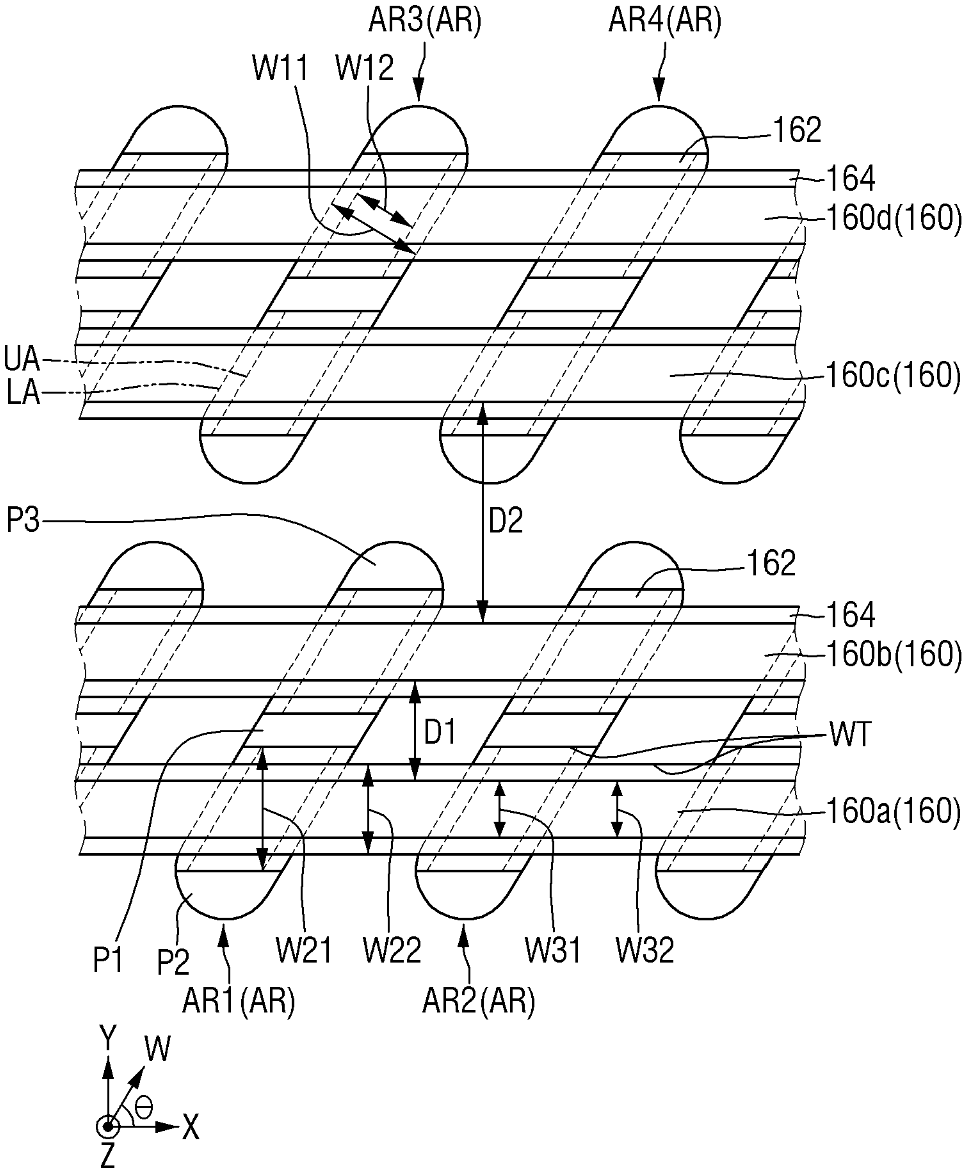
FIGS. 4, 5, and 6 are various partial layout diagrams for illustrating the semiconductor memory device of FIGS. 1, 2, and 3.
Figure 5:
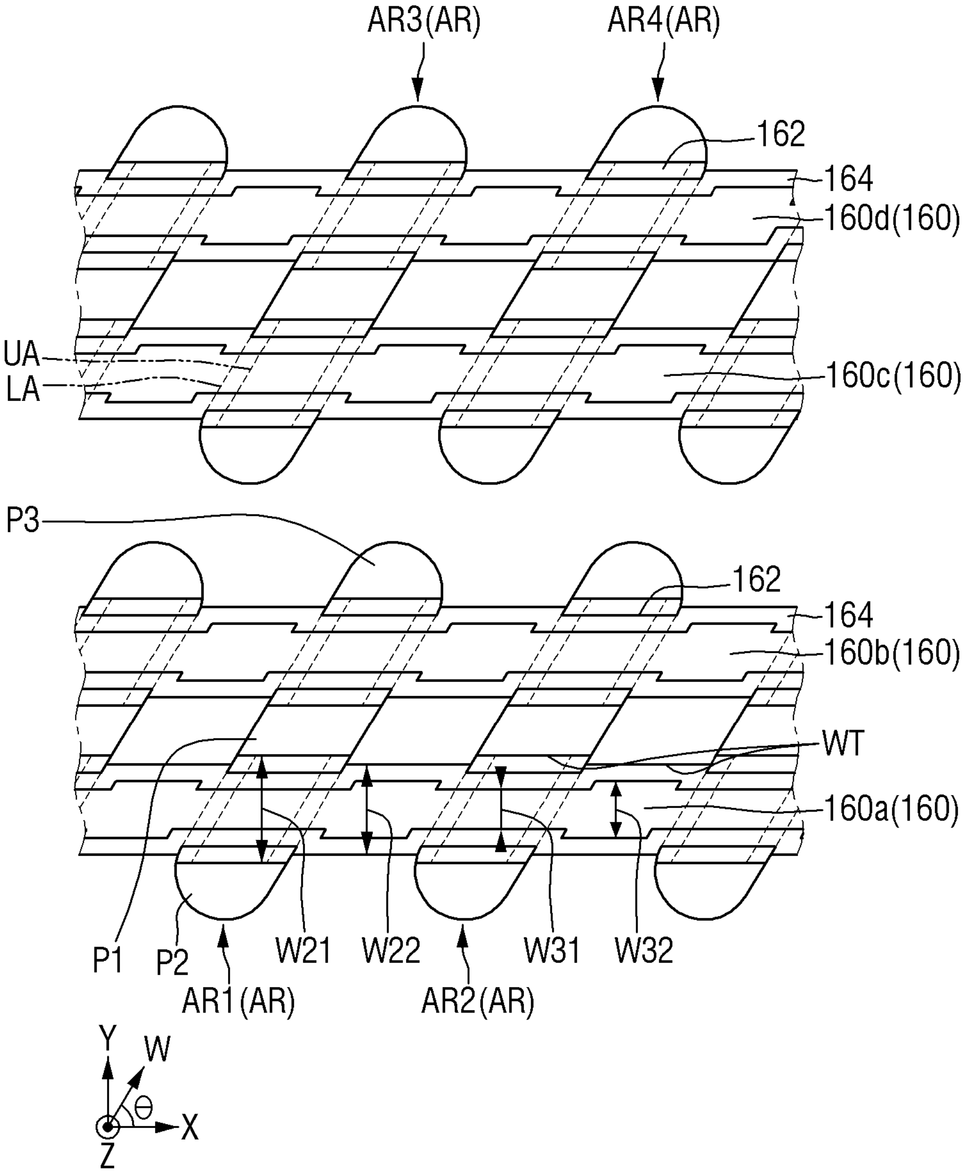
Figure 6:
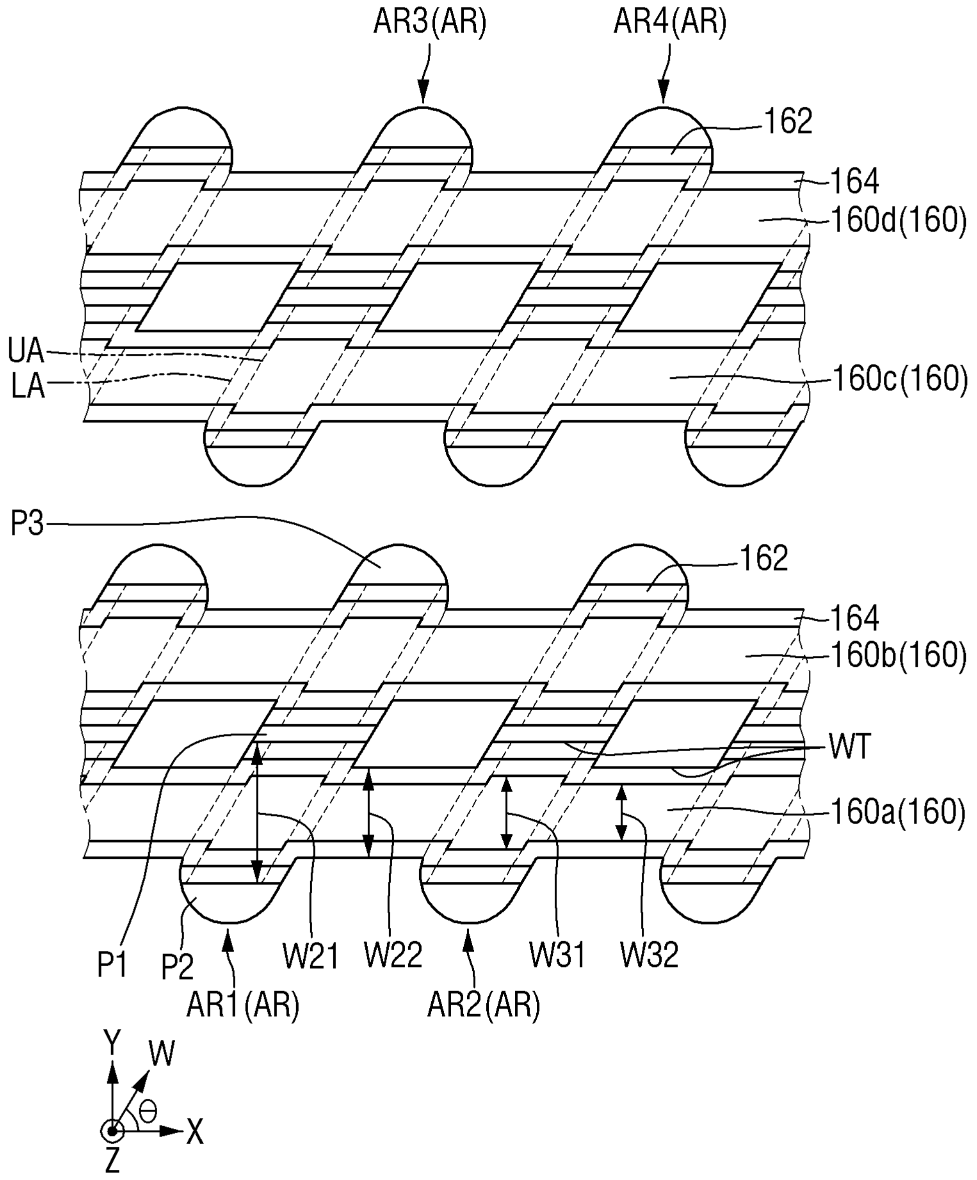

FIG. 1 is a layout diagram for illustrating a semiconductor memory device according to some embodiments. FIG. 2 is a cross-sectional view taken along a line A-A of FIG. 1. FIG. 3 is a cross-sectional view taken along a line B-B of FIG. 1. FIG. 4 to FIG. 6 are various partial layout diagrams for illustrating the semiconductor memory device of FIG. 1 to FIG. 3.

Referring to FIGS. 1 to 4, a semiconductor memory device according to some embodiments includes a substrate 100, an element isolation pattern 105, a base insulating film 120, a first conductive pattern 130, a direct contact DC, a first capping pattern 136 and 137, a spacer structure 140, a buried contact BC, a landing pad LP, a second conductive pattern 160, an interfacial film 162, a gate dielectric film 164, a second capping pattern 166, an insulating fence 170, an isolation insulating film 180 and a capacitor structure 190.

The substrate 100 may have a structure in which a base substrate and an epitaxial layer are stacked. However, the present disclosure is not limited thereto. The substrate 100 may be a silicon substrate, a gallium arsenide substrate, a silicon germanium substrate, or a SOI (Semiconductor On Insulator) substrate. By way of example, an example in which the substrate 100 is the silicon substrate is described below.

The substrate 100 may include an active area AR. As a design rule of a semiconductor memory device decreases, the active area AR may be formed in a form of a bar of a diagonal line. For example, as shown in FIG. 1, the active area AR extends in a form of a bar in a third direction W different from a first direction Y and a second direction X in a plane (XY plane) including the first direction Y and the second direction X. In some embodiments, the third direction W may have an acute angle θ with respect to the second direction X. The acute angle θ may be, for example, about 60°. However, the present disclosure is not limited thereto.

A plurality of active areas AR may be provided, and the active areas AR may extend in a parallel manner to each other and extend in a bar shape. Each active area AR may have a portion containing impurities which may act as a source/drain area.

In some embodiments, the plurality of active areas AR may be arranged in a lattice manner. For example, some of the plurality of active areas AR may constitute a series of rows arranged along the first direction Y, and the others of the plurality of active areas AR may constitute a series of columns arranged along the second direction X. The active areas AR arranged in the lattice structure may further improve the integration of the semiconductor memory device.

In one example, as shown in FIG. 4, the plurality of active areas AR may include first to fourth active patterns AR1 to AR4 that are adjacent to each other and are arranged in a lattice structure. The first active pattern AR1 and the second active pattern AR2 may be arranged along the second direction X. The first active pattern AR1 and the third active pattern AR3 may be arranged along the first direction Y. The second active pattern AR2 and the fourth active pattern AR4 may be arranged along the first direction Y. The third active pattern AR3 and fourth active pattern AR4 may be arranged along the second direction X.

The element isolation pattern 105 may be provided in the substrate 100 and may define the active area AR. In FIG. 2 and FIG. 3, it is shown that a side surface of the element isolation pattern 105 has an inclination (e.g., is angled with respect to a major surface of the substrate 100). However, this is only a feature due to a process. The present disclosure is not limited thereto.

The element isolation pattern 105 may include an insulating material, for example, at least one of silicon oxide, silicon nitride, silicon oxynitride, or silicon oxycarbonitride, or a combination of two or more thereof. However, the present disclosure is not limited thereto. The element isolation pattern 105 may be embodied as a single film made of one type of an insulating material, or may be embodied as a stack of multi-films made of a combination of several types of insulating materials.

The base insulating film 120 may be formed on the substrate 100 and the element isolation pattern 105. The base insulating film 120 may extend along an upper surface of the substrate 100 or an upper surface of the element isolation pattern 105.

The base insulating film 120 may be embodied as a single film or may be embodied as a stack of multi-films film as shown. For example, the base insulating film 120 may include a first insulating film 121, a second insulating film 122, and a third insulating film 123 sequentially stacked on the substrate 100 and the element isolation pattern 105. In one example, the first insulating film 121 may include a silicon oxide film. The second insulating film 122 may include a material having an etch selectivity different from that of the first insulating film 121. In one example, the second insulating film 122 may include a silicon nitride film. The third insulating film 123 may include a material having a dielectric constant lower than that of the second insulating film 122. In one example, the third insulating film 123 may include a silicon oxide film.

The first conductive pattern 130 may be formed on the base insulating film 120. That is, the base insulating film 120 may be interposed between the substrate 100 and the first conductive pattern 130 and/or between the element isolation pattern 105 and the first conductive pattern 130. The first conductive pattern 130 may extend in an elongate manner in the first direction Y and in a parallel manner to the upper surface of the substrate 100. For example, the first conductive pattern 130 may obliquely intersect the active area AR and perpendicularly intersect the second conductive pattern 160. A plurality of first conductive patterns 130 may be spaced apart from each other in the second direction X and may extend side by side (or in a parallel manner to each other) in the first direction Y. The first conductive patterns 130 may act as bit-lines of the semiconductor memory device. In some embodiments, the plurality of first conductive pattern 130 may be spaced apart from each other in the second direction X by an equal spacing.

Each first conductive pattern 130 may be embodied as a single film, or may be embodied as a stack of multi-films as shown. For example, the first conductive pattern 130 may include a first conductive line 131, a second conductive line 132, and a third conductive line 133 sequentially stacked on the substrate 100. Each of the first conductive line 131, the second conductive line 132, and the third conductive line 133 may include a conductive material, for example, at least one of polysilicon, TiN, TiSiN, tungsten, or tungsten silicide, or a combination of two or more thereof. However, the present disclosure is not limited thereto. In one example, the first conductive line 131 may include polysilicon, the second conductive line 132 may include TiSiN, and the third conductive line 133 may include tungsten.

The direct contact DC may be formed on the substrate 100 and the element isolation pattern 105. The direct contact DC may connect the active area AR and the first conductive pattern 130 to each other. For example, a first contact trench CT1 may extend through the base insulating film 120 so as to expose a first portion P1 of the active area AR. The direct contact DC may be formed in the first contact trench CT1 so as to electrically connect the first portion P1 of the active area AR and the first conductive pattern 130 to each other. The first portion P1 of the active area AR connected to the direct contact DC may act as a first source/drain area of a transistor using the second conductive pattern 160 as a gate electrode.

In some embodiments, the first portion P1 may be a center portion of each active area AR. That is, the direct contact DC may contact the center of the active area AR. In some embodiments, a portion of the first contact trench CT1 may overlap a portion of the element isolation pattern 105. Accordingly, the first contact trench CT1 may expose a portion of the element isolation pattern 105 as well as the first portion P1 of the active area AR.

In some embodiments, a width in the first direction Y of the direct contact DC may be smaller than a width in the first direction Y of the first contact trench CT1. In some embodiments, a width of the first conductive pattern 130 may also be smaller than the width in the first direction Y of the first contact trench CT1. For example, the width of the first conductive pattern 130 may be the same as the width in the first direction Y of the direct contact DC.

The direct contact DC may include a conductive material, for example, at least one of polysilicon, TiN, TiSiN, tungsten, or tungsten silicide, or a combination of two or more thereof. However, the present disclosure is not limited thereto. In one example, the direct contact DC may include polysilicon.

The first capping pattern 136 and 137 may be formed on the first conductive pattern 130. The first capping pattern 136 and 137 may extend along an upper surface of the first conductive pattern 130. The first capping pattern 136 and 137 may be embodied as a single film, or may be embodied as a stack of multiple films as shown. For example, the first capping pattern 136 and 137 may include a first capping line 136 and a second capping line 137 sequentially stacked on the first conductive pattern 130. Each of the first capping line 136 and the second capping line 137 may include an insulating material, for example, at least one of silicon oxide, silicon nitride, silicon oxynitride, or silicon oxycarbonitride, or a combination of two or more thereof. However, the present disclosure is not limited thereto. In one example, each of the first capping line 136 and the second capping line 137 may include a silicon nitride film.

In some embodiments, an etch stop film (not shown) may be interposed between the first capping line 136 and the second capping line 137. The etch stop film may include, for example, a SiN film. However, the present disclosure is not limited thereto.

The spacer structure 140 may be formed on a side surface of the first conductive pattern 130. The spacer structure 140 may extend along a side surface of the first conductive pattern 130 and a side surface of the first capping pattern 136 and 137. In some embodiments, a vertical level of an upper surface of the spacer structure 140 may be equal to or lower than that of an uppermost surface of the first capping pattern 136 and 137. In some embodiments, a height of the upper surface of the spacer structure 140, relative to the upper surface of the substrate 100 may decrease as the spacer structure 140 extends away from the first capping pattern 136 and 137.

The spacer structure 140 may include an insulating material, for example, at least one of silicon oxide, silicon nitride, silicon oxynitride, or silicon oxycarbonitride, or a combination of two or more thereof. However, the present disclosure is not limited thereto. In some embodiments, the spacer structure 140 may be embodied as a stack of multi-films made of a combination of different types of insulating materials. For example, the spacer structure 140 may include a base spacer 141, a first lower spacer 142, a second lower spacer 143, a first side spacer 144, and a second side spacer 145.

The base spacer 141 may be formed on a side surface of the first conductive pattern 130. For example, the base spacer 141 may extend along and conform to a profile of the side surface of the first conductive pattern 130 and at least a portion of the side surface of the first capping pattern 136 and 137. In some embodiments, the base spacer 141 may be an innermost spacer of the spacer structure 140 that contacts the first conductive pattern 130 and the direct contact DC. In some embodiments, the base spacer 141 may directly contact the first conductive pattern 130 or the direct contact DC.

In some embodiments, in an area where the first contact trench CT1 is not formed, the base spacer 141 may extend along the side surface of the first conductive pattern 130 and an upper surface of the base insulating film 120. In some embodiments, in an area where the first contact trench CT1 is formed, the base spacer 141 may extend along the side surface of the first conductive pattern 130, a side surface of the direct contact DC, and the first contact trench CT1.

The first lower spacer 142 may be formed on the base spacer 141 in the first contact trench CT1. For example, the first lower spacer 142 may extend along and conform to a profile of the base spacer 141 in the first contact trench CT1.

The second lower spacer 143 may be formed on the first lower spacer 142 in the first contact trench CT1. For example, the second lower spacer 143 may be in (and may fill) an area of the first contact trench CT1 remaining after the base spacer 141 and the first lower spacer 142 have been formed in the first contact trench CT1.

The first side spacer 144 may be formed on an outer side surface of the base spacer 141. Moreover, the first side spacer 144 may be formed on the first lower spacer 142 and the second lower spacer 143. For example, the first side spacer 144 may extend along and conform to a profile of the side surface of the first conductive pattern 130 and at least a portion of the side surface of the first capping pattern 136 and 137.

The second side spacer 145 may be formed on an outer side surface of the first side spacer 144. Moreover, the first side spacer 144 may be formed on the second lower spacer 143. For example, the second side spacer 145 may extend along and conform to a profile of the side surface of the first conductive pattern 130 and at least a portion of the side surface of the first capping pattern 136 and 137. In some embodiments, the second side spacer 145 may be an outermost spacer of the spacer structure 140 and may be in contact (e.g., direct contact) with the buried contact BC.

In some embodiments, a vertical level of a lower surface of the second side spacer 145 may be lower than that of an uppermost surface of the second lower spacer 143.

Each of the base spacer 141, the first lower spacer 142, the second lower spacer 143, the first side spacer 144 and the second side spacer 145 may include an insulating material, for example, at least one of silicon oxide, silicon nitride, silicon oxynitride, or silicon oxycarbonitride, or a combination of two or more thereof. However, the present disclosure is not limited thereto.

In some embodiments, the first lower spacer 142 may include a different material than that of the base spacer 141 and/or the second lower spacer 143. For example, the first lower spacer 142 may include an insulating material having a dielectric constant lower than that of the base spacer 141 and/or the second lower spacer 143. In one example, the first lower spacer 142 may include a silicon oxide film, and each of the base spacer 141 and the second lower spacer 143 may include a silicon nitride film.

In some embodiments, the first side spacer 144 may include a different material than that of the base spacer 141 and/or the second side spacer 145. For example, the first side spacer 144 may include an insulating material having a dielectric constant lower than that of the base spacer 141 and/or the second side spacer 145. In one example, the first side spacer 144 may include a silicon oxide film, and each of the base spacer 141 and the second side spacer 145 may include a silicon nitride film.

The insulating fence 170 may be formed on the substrate 100 and the element isolation pattern 105. The insulating fence 170 may intersect the first conductive pattern 130 or the spacer structure 140. For example, the insulating fence 170 may extend in the second direction X that is parallel to the upper surface of the substrate 100 and intersects the first direction Y. A plurality of insulating fences 170 may be spaced apart in the first direction Y from each other and extend side by side (or in a parallel manner to each other) in the second direction X. In some embodiments, a plurality of insulating fences 170 may be spaced apart in the first direction Y from each other by an equal spacing.

The insulating fence 170 may include an insulating material, for example, at least one of silicon oxide, silicon nitride, silicon oxynitride, or silicon oxycarbonitride, or a combination of two or more thereof. However, the present disclosure is not limited thereto. In one example, the insulating fence 170 may include a silicon nitride film.

In some embodiments, each of some of the plurality of insulating fences 170 may overlap the first portion P1 of the active area AR in a direction (the fourth direction Z) perpendicular to the upper surface of the substrate 100. In some embodiments, each of the others of the plurality of insulating fences 170 may be interposed between two active areas AR arranged along the first direction Y in a plan view.

The buried contact BC may be formed on the substrate 100 and the element isolation pattern 105. Moreover, the buried contact BC may be formed on a side surface of the first conductive pattern 130 and a side surface of the insulating fence 170. For example, the plurality of first conductive patterns 130 and the plurality of insulating fences 170 intersecting each other may define a plurality of isolated areas therebetween. A buried contact BC may be provided in each of the isolated areas. In some embodiments, a plurality of buried contacts BC may be arranged in a lattice structure.

Moreover, the buried contact BC may be spaced from the first conductive pattern 130 via the spacer structure 140. For example, the buried contact BC may extend along a portion of an outer side surface of the spacer structure 140. In some embodiments, a vertical level of the uppermost surface of the buried contact BC may be lower than that of the uppermost surface of the first capping pattern 136 and 137. The spacer structure 140 may electrically isolate the first conductive pattern 130 and the buried contact BC from each other.

The buried contact BC may be connected to the active area AR. For example, a second contact trench CT2 may extend through the base insulating film 120 and may expose a second portion P2 or a third portion P3 of the active area AR. The second contact trenches CT2 may be formed between adjacent ones of the plurality of first conductive pattern 130 and between adjacent ones of the plurality of insulating fences 170. The buried contact BC may be formed in the second contact trench CT2 and may be electrically connected to the second portion P2 or the third portion P3 of the active area AR. The second portion P2 or the third portion P3 of the active area AR connected to the buried contact BC may act as a second source/drain area of a transistor using the second conductive pattern 160 as a gate electrode.

In some embodiments, the second portion P2 and the third portion P3 may be opposing ends of the active areas AR, respectively. That is, the buried contact BC may be connected to each of both opposing ends of the active area AR. In some embodiments, a portion of the second contact trench CT2 may overlap a portion of the element isolation pattern 105. Accordingly, the second contact trench CT2 may expose a portion of the element isolation pattern 105 as well as the second portion P2 or the third portion P3 of the active area AR.

The buried contact BC may include a conductive material, for example, at least one of polysilicon, TiN, TiSiN, tungsten, or tungsten silicide, or a combination of two or more thereof. However, the present disclosure is not limited thereto. In one example, the buried contact BC may include polysilicon.

The second conductive pattern 160 may be formed on the substrate 100 and the element isolation pattern 105. The second conductive pattern 160 may extend in a parallel manner to the upper surface of the substrate 100 and may extend in an elongate manner in the second direction X intersecting the first direction Y. Moreover, the second conductive pattern 160 may intersect the active area AR between the direct contact DC and the buried contact BC. For example, the second conductive pattern 160 may obliquely intersect the active area AR and perpendicularly intersect the first conductive pattern 130. A plurality of second conductive patterns 160 may be spaced apart from each other and may extend side by side (or in a parallel manner to each other) in the second direction X. The second conductive patterns 160 may act as word-lines of the semiconductor memory device.

The second conductive pattern 160 may be embedded in the substrate 100. For example, a gate trench WT extending in an elongate manner in the second direction X may be formed in the substrate 100 and the element isolation pattern 105. The second conductive pattern 160 may be in at least a portion of the gate trench WT. In some embodiments, the second conductive pattern 160 may be spaced apart from the upper surface of the substrate 100 and may be in a lower portion of the gate trench WT.

A width of the gate trench WT defined by the active area AR may be greater than a width of the gate trench WT defined by the element isolation pattern 105. In this regard, the width of the gate trench WT may refer to a width in a direction (e.g., the first direction Y) that is perpendicular to a longitudinal direction (e.g., the second direction X) in which the gate trench WT extends. For example, as shown in FIG. 4, a width W21 of a first trench of the gate trench WT in the active area AR may be greater than a width W22 of a second trench of the gate trench WT in the element isolation pattern 105. That is, a side surface of the gate trench WT may protrude toward the active area AR. In other words, a side surface of the active area AR defining the gate trench WT may be positioned inwardly or offset of a side surface of the element isolation pattern 105 defining the gate trench WT.

In some embodiments, the active area AR defining the gate trench WT may include a lower pattern LA and an upper pattern UA on the lower pattern LA. As shown in FIG. 3, the lower pattern LA may be a lower portion of the active area AR covered with the element isolation pattern 105, and the upper pattern UA may be an upper portion of the active area AR not covered with the element isolation pattern 105 or free from coverage by the element isolation pattern 105 so as to be exposed.

In some embodiments, a first pattern width W12 of the upper pattern UA may be smaller than a second pattern width W11 of the lower pattern LA. The upper pattern UA may be formed by recessing an upper portion of the active area AR exposed from the element isolation pattern 105. As shown in FIG. 4, the upper pattern UA may connect the first portion P1 and the second portion P2 to each other, and may connect the first portion P1 and the third portion P3 to each other. As the side surface of the gate trench WT protrudes toward the active area AR, a portion of the upper pattern UA adjacent to the first to third portions P1 to P3 may overlap the element isolation pattern 105 in the second direction X.

In some embodiments, two second conductive patterns 160 may intersect one active area AR. For example, one of the two second conductive patterns 160 may extend across the active area AR in an area between the first portion P1 and the second portion P2, while the other of the second conductive patterns 160 may extend across the active area AR in an area between the first portion P1 and the third portion P3. These two second conductive pattern 160 may share one direct contact DC.

In one example, as shown in FIG. 4, a plurality of second conductive patterns 160 may include first to fourth word-lines 160*a* to 160*d* which are sequentially arranged along the first direction Y and extending side by side or in a parallel manner to each other in the second direction X. The first word-line 160*a* may extend across the first active pattern AR1 in an area between the first portion P1 and the second portion P2 of the first active pattern AR1 and across the second active pattern AR2 in an area between the first portion P1 and the second portion P2 of the second active pattern AR2. The second word-line 160*b* may extend across the first active pattern AR1 in an area between the first portion P1 and the third portion P3 of the first active pattern AR1 and across the second active pattern AR2 in an area between the first portion P1 and the third portion P3 of the second active pattern AR2. The third word-line 160*c* may extend across the third active pattern AR3 in an area between the first portion P1 and the second portion P2 of the third active pattern AR3 and across the fourth active pattern AR4 in an area between the first portion P1 and the second portion P2 of the fourth active pattern AR4. The fourth word-line 160*d* may extend across the third active pattern AR3 in an area between the first portion P1 and third portion P3 of the third active pattern AR3 and across the fourth active pattern AR4 in an area between the first portion P1 and third portion P3 of the fourth active pattern AR4.

The second conductive pattern 160 may include a conductive material, at least one of, for example, polysilicon, TiN, TiSiN, tungsten, or tungsten silicide, or a combination of two or more thereof. However, the present disclosure is not limited thereto. Although the second conductive pattern 160 is shown as a single film, this is only an example and the second conductive pattern 160 may be embodied as a stack of multiple films.

In some embodiments, a distance by which two adjacent second conductive patterns 160 are spaced apart from each other may be smaller than a distance by which two other adjacent second conductive patterns 160 are spaced apart from each other. For example, as shown in FIG. 4, a first distance D1 by which the first word-line 160*a* and the second word-line 160*b* are spaced from each other may be smaller than a second distance D2 by which the second word-line 160*b* and the third word-line 160*c* are spaced from each other. These second conductive patterns 160 may further improve the integration of the semiconductor memory device in the first direction Y.

The gate dielectric film 164 may be formed in the gate trench WT. The gate dielectric film 164 may be interposed between the active area AR and the second conductive pattern 160. For example, the gate dielectric film 164 may extend along the gate trench WT, and the second conductive pattern 160 may fill a portion of the gate trench WT while being disposed on the gate dielectric film 164.

The gate dielectric film 164 may include, for example, at least one of silicon oxide, silicon oxynitride, silicon nitride, or a high-k material with a higher dielectric constant than that of silicon oxide. However, the present disclosure is not limited thereto.

In some embodiments, the interfacial film 162 may be interposed between the active area AR and the gate dielectric film 164. The interfacial film 162 may include an oxide of a material constituting the active area AR. For example, the interfacial film 162 may be an oxide film formed by oxidizing a surface of the active area AR exposed through the gate trench WT. In one example, when the substrate 100 is a silicon substrate, the interfacial film 162 may include a silicon oxide film.

The interfacial film 162 may be formed on a surface of the active area AR as not covered with the element isolation pattern 105 so as to be exposed. For example, as shown in FIGS. 2 and 3, the interfacial film 162 may extend along and conform to a profile of the active area AR defining the gate trench WT. The interfacial film 162 may extend along and conform to profiles of a side surface and an upper surface of the upper pattern UA. The interfacial film 162 may not extend along the element isolation pattern 105. The gate dielectric film 164 may extend along and conform to profiles of side and upper surfaces of the interfacial film 162 and an upper surface of the element isolation pattern 105.

Moreover, as described above with respect to FIG. 4, as the side surface of the gate trench WT protrudes toward the active area AR, the interfacial film 162 may extend along the side surface of the active area AR provided inwardly of a side surface of the element isolation pattern 105. For example, the interfacial film 162 may extend along a side surface of the first portion P1, a side surface of the second portion P2, and a side surface of the third portion P3. The gate dielectric film 164 may extend along and conform to profiles of the side surface of the interfacial film 162 and the side surface of the element isolation pattern 105.

In some embodiments, and as seen in FIG. 4, a first gate width W31 of a portion of the second conductive pattern 160 in the active area AR may be the same as a second gate width W32 of a portion of the second conductive pattern 160 in the element isolation pattern 105. For example, as shown in FIG. 4, a dimension by which the side surface of the gate trench WT protrudes toward the active area AR may be the same as a thickness of the interfacial film 162. In this case, the gate dielectric film 164 may extend in a straight line in the second direction X along the side surface of the interfacial film 162 and the side surface of the element isolation pattern 105 in a plan view. Moreover, a side surface of the second conductive pattern 160 may extend in a straight line along the side surface of the gate dielectric film 164 in the second direction X. As used herein, the term "the same" means not only "perfectly the same", but also is intended to include minute differences that may occur due to a process margin.

The second capping pattern 166 may be formed on the second conductive pattern 160. The second capping pattern 166 may extend along an upper surface of the second conductive pattern 160. For example, the second capping pattern 166 may be in (and may e.g., fill) an upper portion of the gate trench WT remaining after the interfacial film 162, the gate dielectric film 164, and the second conductive pattern 160 are formed in the gate trench WT. The second capping pattern 166 may include an insulating material, at least one of, for example, silicon oxide, silicon nitride, silicon oxynitride, or silicon oxycarbonitride, or a combination of two or more thereof. However, the present disclosure is not limited thereto. The second capping pattern 166 may be a single film or a stack of multi-layers made of a combination of various types of insulating materials.

In some embodiments, the insulating fence 170 may not overlap the second conductive pattern 160 in the fourth direction Z. For example, the insulating fence 170 may be formed on the active area AR and/or the element isolation pattern 105 and may not be formed on the second capping pattern 166.

The landing pad LP may be formed on the buried contact BC. The landing pad LP may be arranged so as to overlap the buried contact BC in the fourth direction Z. The landing pad LP may contact the upper surface of the buried contact BC and may connect the active area AR of the substrate 100 with the capacitor structure 190 as described below.

The landing pad LP may include a conductive material, at least one of, for example, polysilicon, TiN, TiSiN, tungsten, or tungsten silicide, or a combination of two or more thereof. However, the present disclosure is not limited thereto. In one example, the landing pad LP may include tungsten (W). The capacitor structure 190 may be electrically connected to the second portion P2 or the third portion P3 of the active area AR via the buried contact BC and the landing pad LP.

In some embodiments, relative to the upper surface of the substrate 100, a vertical level of an uppermost surface of the landing pad LP may be higher than a vertical level of an uppermost surface of the first capping pattern 136 and 137. The landing pad LP may cover at least a portion of an upper surface of the spacer structure 140 and/or at least a portion of the upper surface of the first capping pattern 136 and 137.

In some embodiments, relative to the upper surface of the substrate 100, a vertical level of the uppermost surface of the landing pad LP may be higher than a vertical level of an uppermost surface of the insulating fence 170. This landing pad LP may cover at least a portion of the upper surface of the insulating fence 170.

The landing pads LP may be respectively formed as a plurality of isolated areas spaced apart from each other and defined by the plurality of first capping patterns 136 and 137, the plurality of spacer structures 140, and the plurality of insulating fences 170. For example, a pad trench PT that isolates upper portions of the landing pads LP from each other may be formed. The pad trench PT may extend from the upper surface of the landing pad LP. A vertical level of a lower surface of the pad trench PT may be lower than that of the upper surface of the spacer structure 140 and may be higher than that of a lower surface of the first capping pattern 136 and 137. Moreover, at least a portion of the pad trench PT may overlap at least a portion of the spacer structure 140 in the fourth direction Z. In one example, the pad trench PT may overlap a portion of the spacer structure 140 and a portion of the first capping pattern 136 and 137 in the fourth direction Z. Accordingly, the plurality of landing pads LP may be respectively formed as the plurality of isolated areas spaced from each other via the pad trench PT.

In some embodiments, the isolation insulating film 180 may be formed within the pad trench PT. The isolation insulating film 180 may include, for example, at least one of silicon oxide, silicon oxynitride, silicon nitride, or a low-k material with a lower dielectric constant than that of silicon oxide. However, the present disclosure is not limited thereto. The plurality of landing pads LP may be electrically insulated from each other via the isolation insulating film 180.

In some embodiments, the plurality of landing pads LP isolated from each other via the pad trench PT may be arranged in a honeycomb structure. The landing pads LP arranged in the honeycomb structure may further improve the integration of the semiconductor memory device.

The capacitor structure 190 may be formed on the isolation insulating film 180 and the landing pad LP. The capacitor structure 190 may contact the upper surface of the landing pad LP. For example, the isolation insulating film 180 may be patterned so as to expose at least a portion of the upper surface of each of the plurality of landing pads LP. A plurality of capacitor structures 190 may respectively contact corresponding landing pads LP. The capacitor structure 190 may store therein data under control of the first conductive pattern 130 acting as the bit-line and the second conductive pattern 160 acting as the word-line.

In some embodiments, the capacitor structure 190 may include a lower electrode pattern 192, a capacitor dielectric film 194, and an upper electrode pattern 196 sequentially stacked on the landing pad LP. The capacitor structure 190 may store charges in the capacitor dielectric film 194 using a potential difference generated between the lower electrode pattern 192 and the upper electrode pattern 196.

Each of the lower electrode pattern 192 and the upper electrode pattern 196 may include, for example, doped polysilicon, metal, or metal nitride. However, the present disclosure is not limited thereto. Further, the capacitor dielectric film 194 may include at least one of, for example, silicon oxide, silicon oxynitride, silicon nitride, or a high-k material with a higher dielectric constant than that of silicon oxide. However, the present disclosure is not limited thereto.

Referring to FIG. 5, in a semiconductor memory device according to some embodiments, the first gate width W31 of the portion of the second conductive pattern 160 in the active area AR may be smaller than the second gate width W32 of the portion of the second conductive pattern 160 in the element isolation pattern 105.

For example, a dimension by which the side surface of the gate trench WT protrudes toward the active area AR may be smaller than the thickness of the interfacial film 162. In this case, a portion of the interfacial film 162 may protrude beyond the element isolation pattern 105 toward the gate dielectric film 164. The gate dielectric film 164 may extend along and conform to profiles of the side surface of the interfacial film 162 and the side surface of the element isolation pattern 105. The second conductive pattern 160 may be formed on the gate dielectric film 164 so as to be in (e.g., fill) at least a portion of the gate trench WT. Accordingly, the portion of the second conductive pattern 160 in the active area AR may have a relatively smaller width.

Referring to FIG. 6, in a semiconductor memory device according to some embodiments, the first gate width W31 of the portion of the second conductive pattern 160 in the active area AR may be greater than the second gate width W32 of the portion of the second conductive pattern 160 in the element isolation pattern 105.

For example, a dimension by which the side surface of the gate trench WT protrudes toward the active area AR may be greater than the thickness of the interfacial film 162. In this case, a portion of the element isolation pattern 105 may protrude beyond the interfacial film 162 toward the gate dielectric film 164. The gate dielectric film 164 may extend along and conform to profiles of the side surface of the interfacial film 162 and the side surface of the element isolation pattern 105. The second conductive pattern 160 may be formed on the gate dielectric film 164 so as to be in (e.g., fill) at least a portion of the gate trench WT. Accordingly, the portion of the second conductive pattern 160 in the active area AR may have a relatively larger width.

Figure 7:
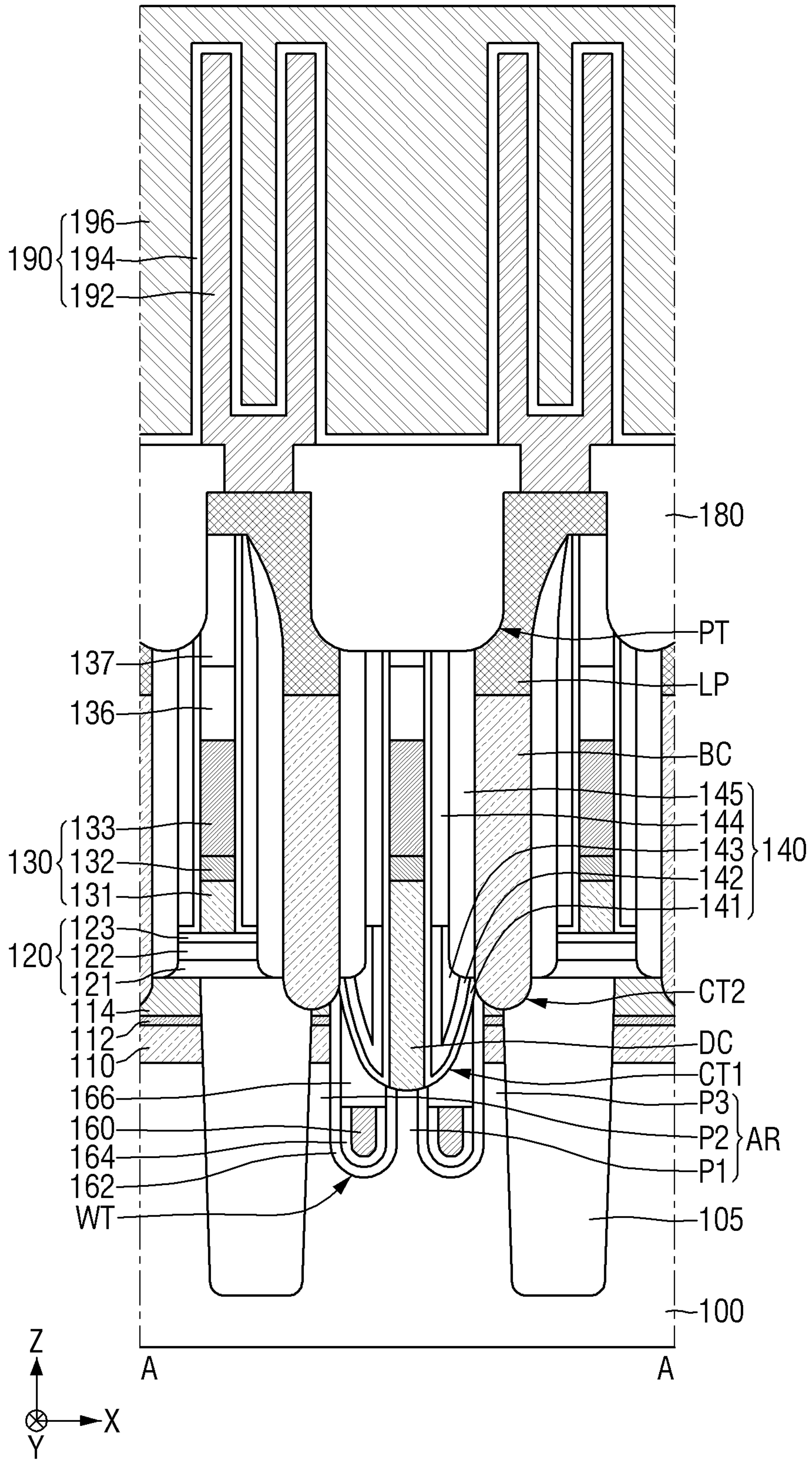
FIG. 7 is a cross-sectional view for illustrating a semiconductor memory device according to some embodiments.

FIG. 7 is a cross-sectional view for illustrating a semiconductor memory device according to some embodiments. For convenience and brevity, descriptions duplicate with the descriptions as set forth above using FIGS. 1 to 6 are briefly set forth or are omitted.

Referring to FIG. 7, a semiconductor memory device according to some embodiments further includes a base semiconductor film 110, a base silicide film 112, and a base metal film 114.

The base semiconductor film 110, the base silicide film 112, and the base metal film 114 may be sequentially stacked on the substrate 100. The base semiconductor film 110, base silicide film 112, and base metal film 114 may be interposed between the substrate 100 and the base insulating film 120. The element isolation pattern 105 may define the active area AR in the substrate 100, the base semiconductor film 110, the base silicide film 112, and the base metal film 114.

The base semiconductor film 110 may extend along the upper surface of the substrate 100. The base semiconductor film 110 may include a semiconductor material doped with impurities. For example, the base semiconductor film 110 may include polysilicon containing the impurities. In one example, the base semiconductor film 110 may include a polysilicon film doped with p-type impurities, such as B. In, Ga, or Al. In another example, the base semiconductor film 110 may include a polysilicon film doped with n-type impurities, for example, P. Sb, or As.

The base silicide film 112 may extend along an upper surface of the base semiconductor film 110. The base silicide film 112 may include, for example, a metal silicide material, such as nickel silicide, cobalt silicide, tungsten silicide, titanium silicide, niobium silicide, or tantalum silicide.

The base metal film 114 may extend along an upper surface of the base silicide film 112. The base metal film 114 may include, for example, a metal material such as titanium (Ti), tantalum (Ta), tungsten (W), nickel (Ni), cobalt (Co), or platinum (Pt).

In some embodiments, the base silicide film 112 may be formed by reacting elements included in the base metal film 114 with the base semiconductor film 110.

In some embodiments, the first contact trench CT1 may extend through the base semiconductor film 110, the base silicide film 112, and the base metal film 114 so as to expose the substrate 100. The direct contact DC may be formed in the first contact trench CT1 so as to contact the active area AR of the substrate 100.

In some embodiments, the second contact trench CT2 may expose the base metal film 114. For example, a portion of the second contact trench CT2 may be formed as a concave recess defined in an upper portion of the base metal film 114. The buried contact BC may be formed in the second contact trench CT2 so as to come into contact with the base metal film 114.

In some embodiments, the gate trench WT may extend through the base semiconductor film 110, the base silicide film 112 and the base metal film 114. In some embodiments, a vertical level of the upper surface of the second conductive pattern 160 may be lower than that of a lower surface of the base semiconductor film 110.

Figure 8:
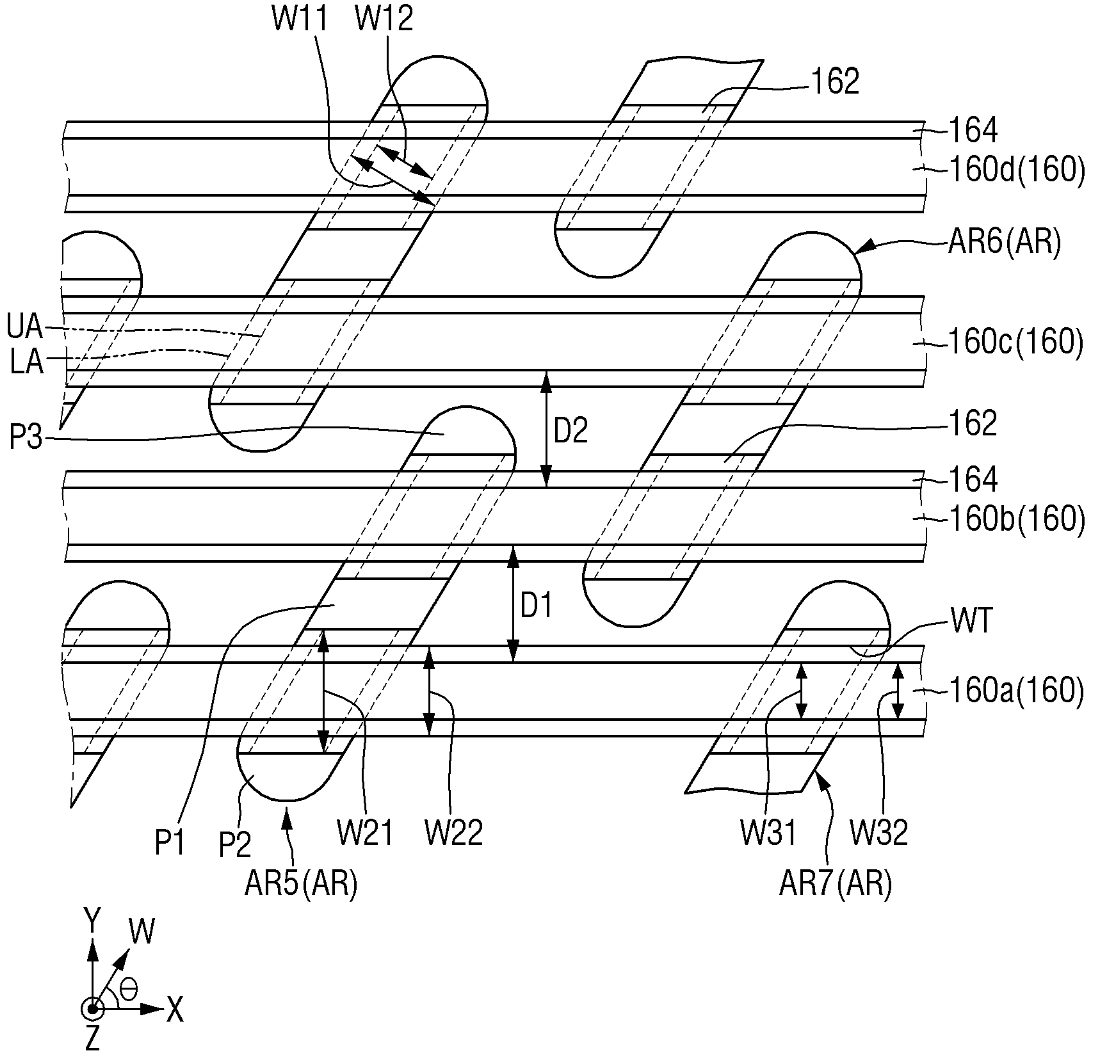
FIG. 8 is a partial layout diagram for illustrating a semiconductor memory device according to some embodiments.

FIG. 8 is a partial layout diagram for illustrating a semiconductor memory device according to some embodiments. For convenience and brevity, descriptions duplicate with the descriptions as set forth above using FIGS. 1 to 7 are briefly set forth or are omitted.

Referring to FIG. 8, in a semiconductor memory device according to some embodiments, an end of one active area AR among the plurality of active areas AR may be arranged adjacent to a center or an end of another active area AR.

In one example, the plurality of active areas AR may include fifth to seventh active patterns AR5 to AR7 adjacent to each other and arranged along the second direction X. The second portion P2 of the sixth active pattern AR6 may be adjacent to the first portion P1 of the fifth active pattern AR5. The third portion P3 of the seventh active pattern AR7 may be adjacent to the second portion P2 of the sixth active pattern AR6. That is, the first portion P1 of the fifth active pattern AR5, the second portion P2 of the sixth active pattern AR6, and the third portion P3 of the seventh active pattern AR7 may be arranged in a row along the second direction X.

The first word-line 160*a* may extend across the fifth active pattern AR5 in an area between the first portion P1 and the second portion P2 of the fifth active pattern AR5 and across the seventh active pattern AR7 in an area between the first portion P1 and the third portion P3 of the seventh active pattern AR7. The second word-line 160*b* may extend across the fifth active pattern AR5 in an area between the first portion P1 and the third portion P3 of the fifth active pattern AR5 and across the sixth active pattern AR6 in an area between the first portion P1 and the second portion P2 of the sixth active pattern AR6. The third word-line 160*c* may extend across the sixth active pattern AR6 in an area between the first portion P1 and the third portion P3 of the sixth active pattern AR6. As shown in FIG. 8, a first distance D1 by which the first word-line 160*a* and the second word-line 160*b* are spaced from each other may be smaller than or may be equal to a second distance D2 by which the second word-line 160*b* and the third word-line 160*c* are spaced from each other.

Hereinafter, a semiconductor memory device according to some embodiments is described with reference to FIGS. 1 to 33. For convenience and brevity, descriptions duplicate with the descriptions as set forth above using FIGS. 1 to 8 are briefly set forth or are omitted.

FIG. 9 to FIG. 33 are diagrams for illustrating intermediate structures corresponding to intermediate steps of a method for manufacturing a semiconductor memory device according to some embodiments.

Figure 9:
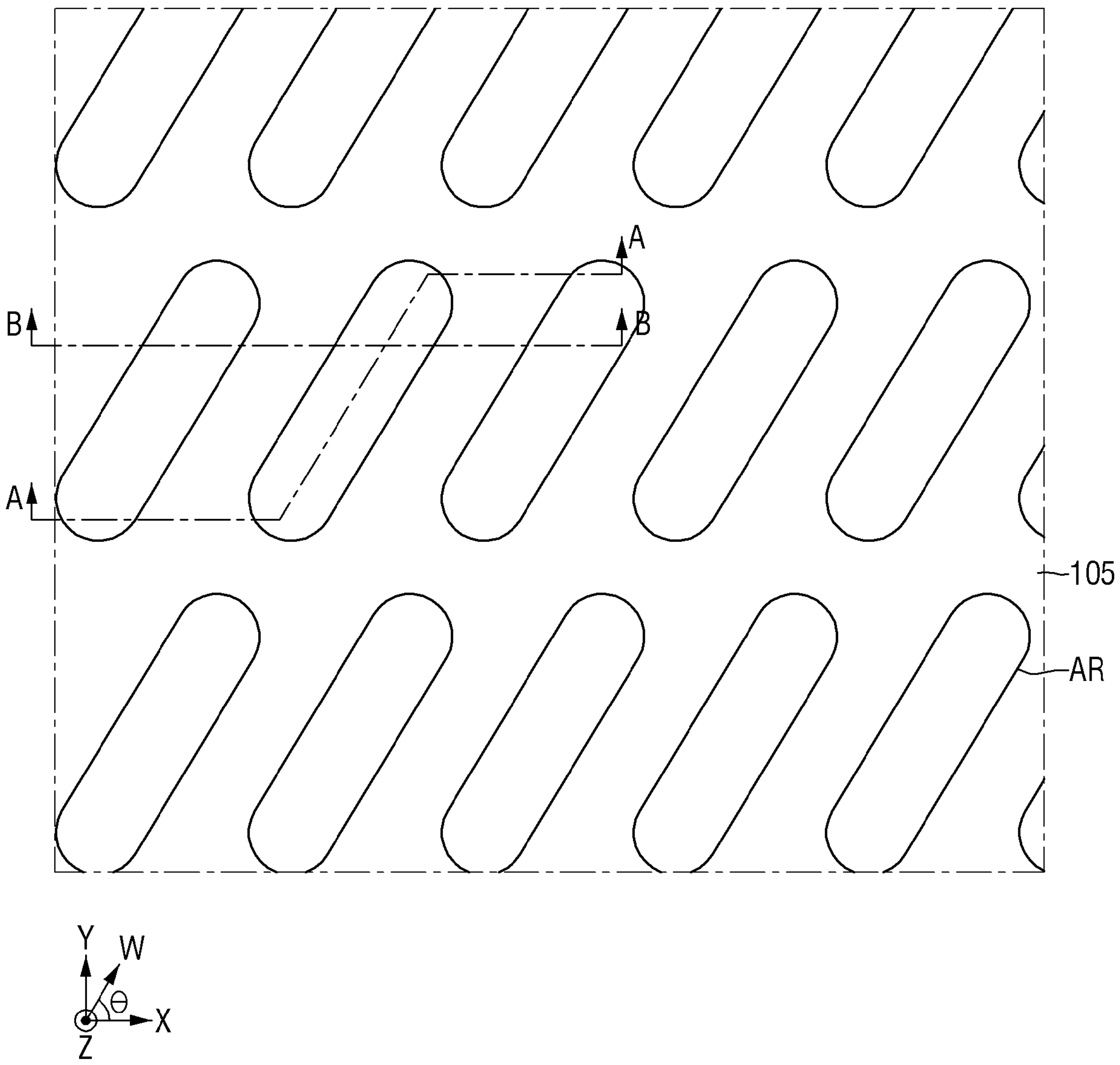
FIG. 9 to FIG. 33 are diagrams for illustrating intermediate structures corresponding to intermediate steps of a method for manufacturing a semiconductor memory device according to some embodiments.
Figure 10:
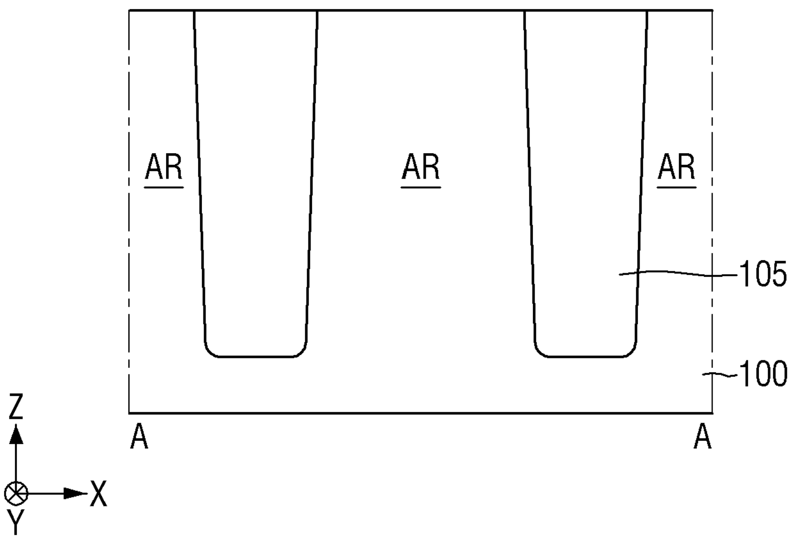
Figure 11:
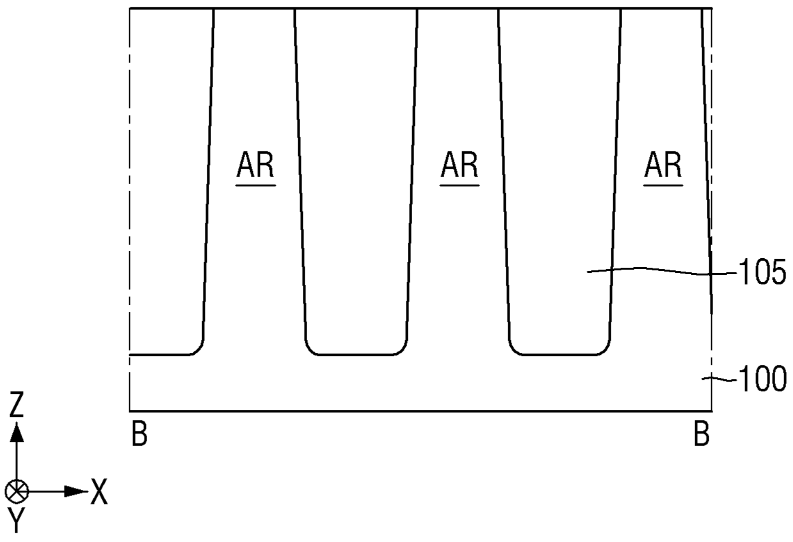

Referring to FIGS. 9 to 11, the element isolation pattern 105 may be formed in the substrate 100. For reference, FIG.

10 is a cross-sectional view taken along a line A-A of FIG. 9, and FIG. 11 is a cross-sectional view taken along a line B-B of FIG. 9.

The element isolation pattern 105 may define each of the plurality of active areas AR in the substrate 100. Each active area AR may be formed in a form of a diagonal bar. For example, each active area AR may have a bar shape extending in the third direction W.

In some embodiments, the plurality of active areas AR may be arranged in a lattice structure. For example, some of the plurality of active areas AR may constitute a series of rows arranged along the first direction Y, and the others of the plurality of active areas AR may constitute a series of columns arranged along the second direction X.

Figure 12:
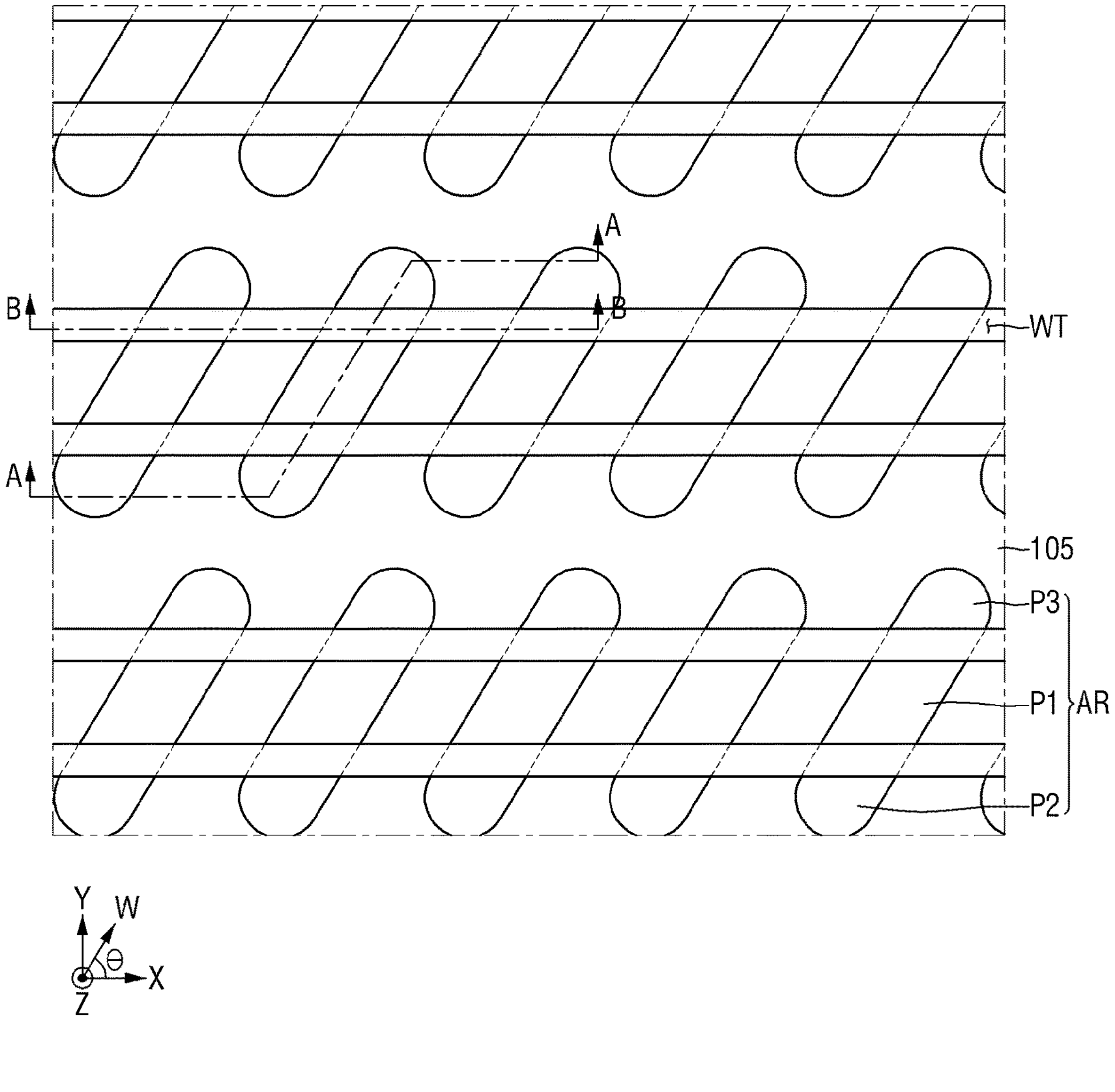
Figure 13:
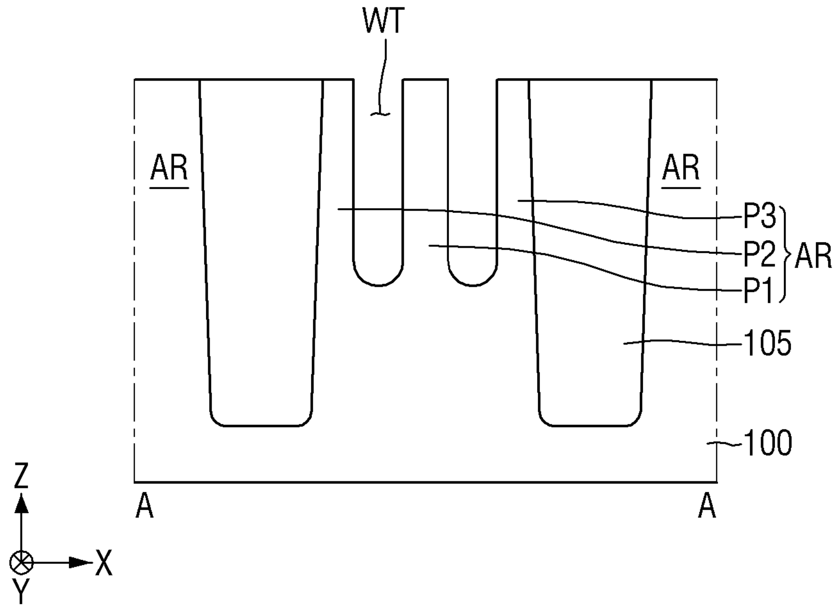
Figure 14:
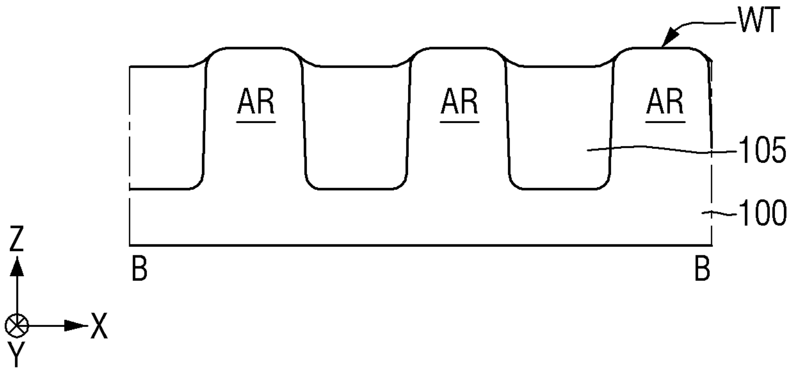

Referring to FIG. 12 to FIG. 14, the gate trench WT is formed in the substrate 100 and the element isolation pattern 105. For reference, FIG. 13 is a cross-sectional view taken along a line A-A of FIG. 12, and FIG. 14 is a cross-sectional view taken along a line B-B of FIG. 12.

The gate trench WT may extend in an elongate manner in the second direction X. Moreover, the gate trench WT may extend across the active area AR. For example, the gate trench WT may extend in the second direction X so as to obliquely intersect the active area AR. A plurality of gate trenches WT may be provided, with the plurality of gate trenches WT spaced apart in the first direction Y from each other and extending side by side (or in a parallel manner to each other) in the second direction X.

In some embodiments, two gate trenches WT may extend across one active area AR. For example, one gate trench WT may extend across the active area AR in an area between the first portion P1 and the second portion P2, and the other gate trench WT may extend across the active area AR in an area between the first portion P1 and the third portion P3.

In some embodiments, as shown in FIG. 14, the upper surface of the active area AR defining the gate trench WT may protrude beyond the upper surface of the element isolation pattern 105 defining the gate trench WT. This may be due to the fact that in an etching process for forming the gate trench WT, an etching rate of the active area AR and an etching rate of the element isolation pattern 105 are different from each other.

Figure 15:
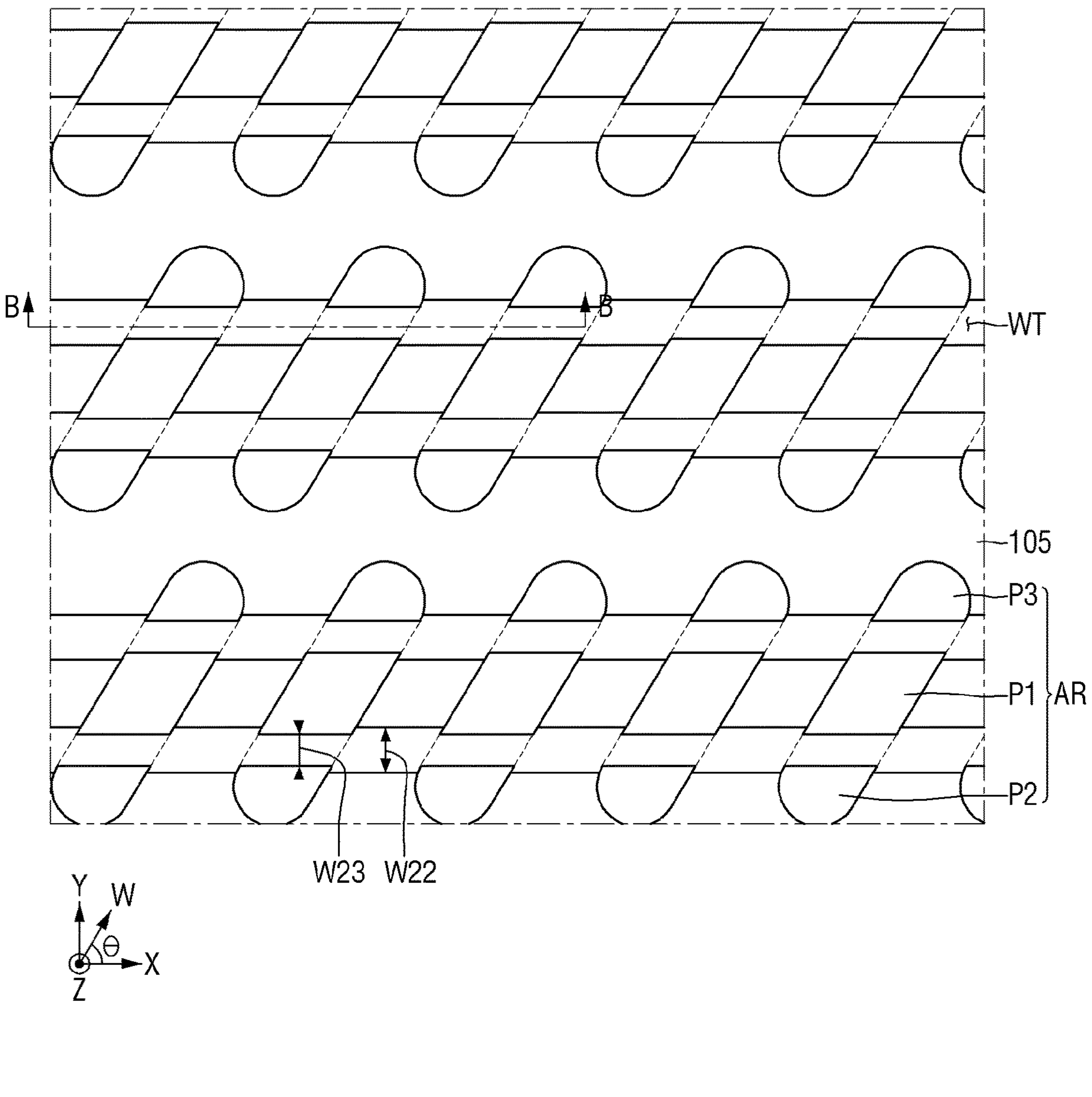
Figure 16:
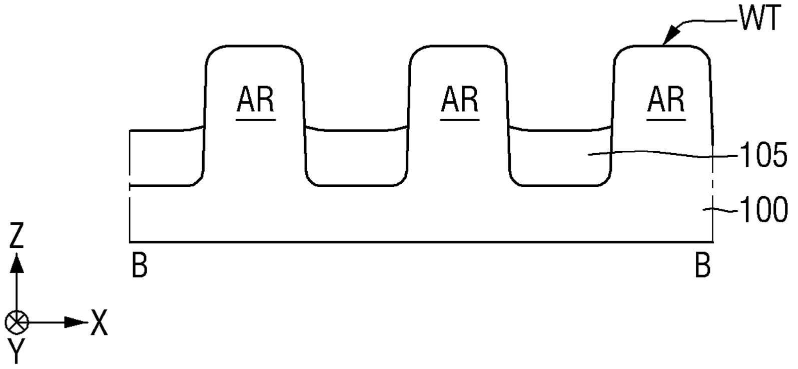

Referring to FIG. 15 and FIG. 16, a first recess process on the element isolation pattern 105 may be performed. For reference, FIG. 16 is a cross-sectional view taken along a line B-B of FIG. 15.

As the first recess process is performed, a portion of the element isolation pattern 105 exposed through the gate trench WT may be recessed. Specifically, as shown in FIG. 15, the side surface of the element isolation pattern 105 defining the gate trench WT may be positioned inwardly or offset of the side surface of the active area AR defining the gate trench WT. In other words, the side surface of the gate trench WT may protrude toward the element isolation pattern 105. That is, the second trench width W22 of the portion of the gate trench WT in the element isolation pattern 105 may be greater than the third trench width W23 of the portion of the gate trench WT in the active area AR.

Moreover, as shown in FIG. 16, the upper surface of the element isolation pattern 105 defining the gate trench WT may be recessed. Accordingly, the active area AR defining the gate trench WT may be not covered with the element isolation pattern 105.

The first recess process may include, for example, a wet etching process. However, the present disclosure is not limited thereto.

Figure 17:
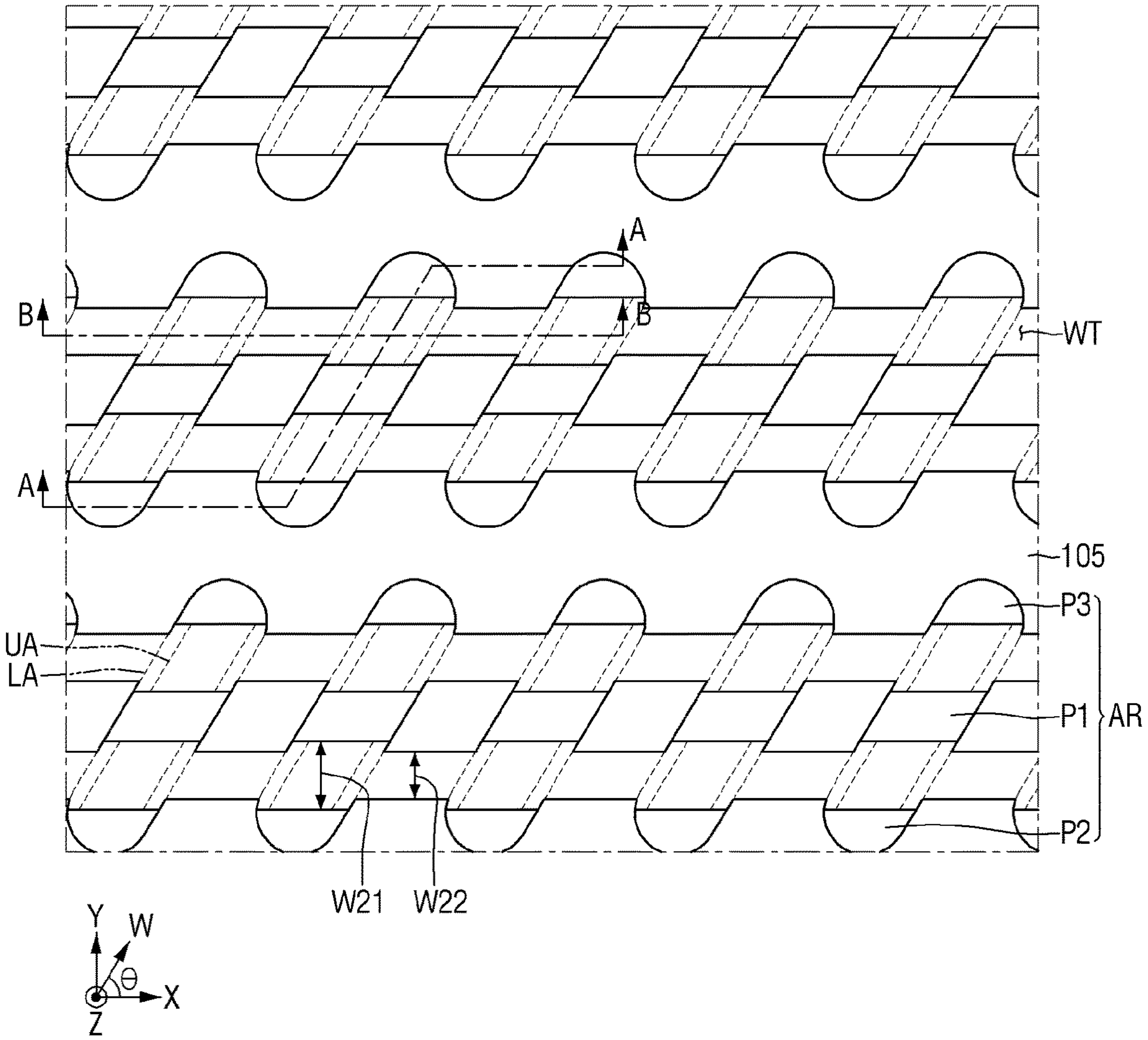
Figure 18:
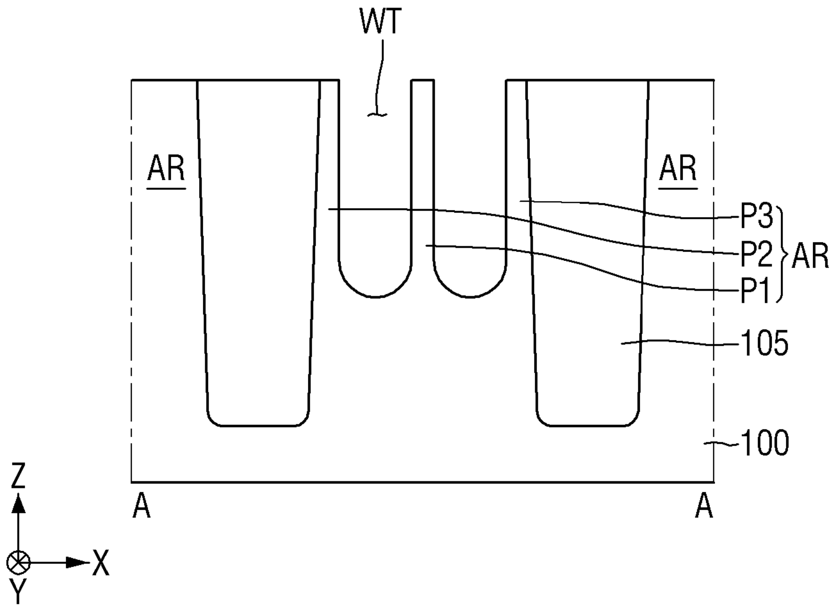
Figure 19:
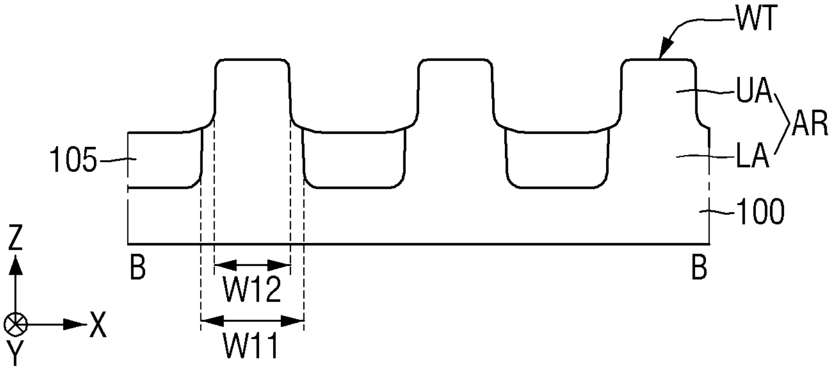

Referring to FIG. 17 to FIG. 19, a second recess process on the active area AR may be performed. For reference, FIG. 18 is a cross-sectional view taken along a line A-A of FIG. 17, and FIG. 19 is a cross-sectional view taken along a line B-B of FIG. 17.

As the second recess process is performed, a portion of the active area AR exposed through the gate trench WT may be recessed. Specifically, as shown in FIG. 17 and FIG. 18, the side surface of the active area AR defining the gate trench WT may be positioned inwardly or offset of the side surface of the element isolation pattern 105 defining the gate trench WT. In other words, the side surface of the gate trench WT may protrude toward the active area AR. That is, the first trench width W21 of the portion of the gate trench WT in the active area AR may be larger than the second trench width W22 of the portion of the gate trench WT in the element isolation pattern 105.

Moreover, as shown in FIG. 17 and FIG. 19, the upper surface of the active area AR not covered with the element isolation pattern 105 may be recessed. Accordingly, the active area AR defining the gate trench WT may include the lower pattern LA and the upper pattern UA. The first pattern width W12 of the upper pattern UA may be smaller than the second pattern width W11 of the lower pattern LA. The upper pattern UA may connect the first portion P1 and the second portion P2 to each other, and may connect the first portion P1 and the third portion P3 to each other. As the side surface of the gate trench WT protrudes toward the active area AR, a portion of the upper pattern UA adjacent to the first to third portions P1 to P3 may overlap the element isolation pattern 105 in the second direction X.

The second recess process may include, for example, a wet etching process. However, the present disclosure is not limited thereto.

Figure 20:
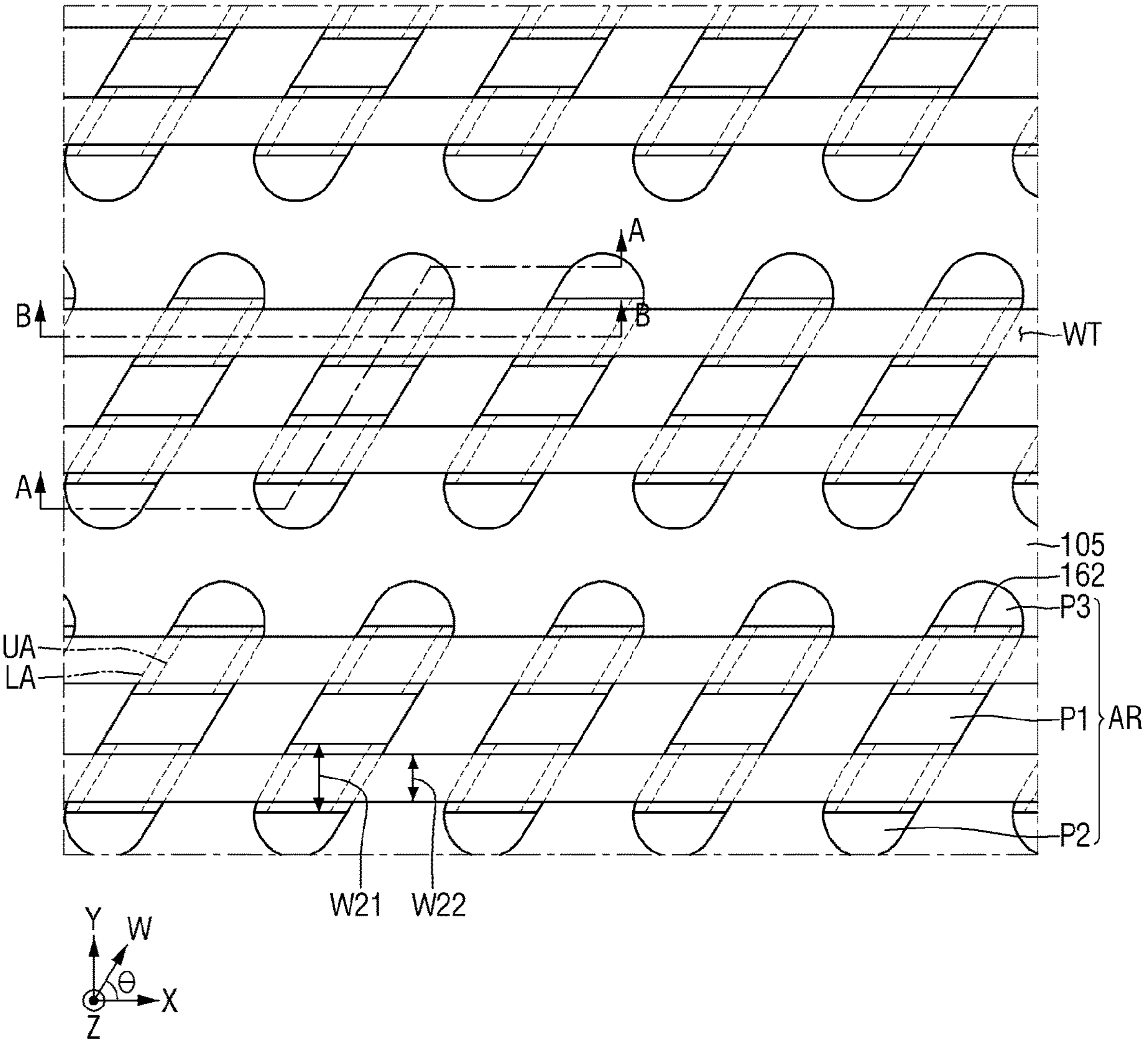
Figure 21:
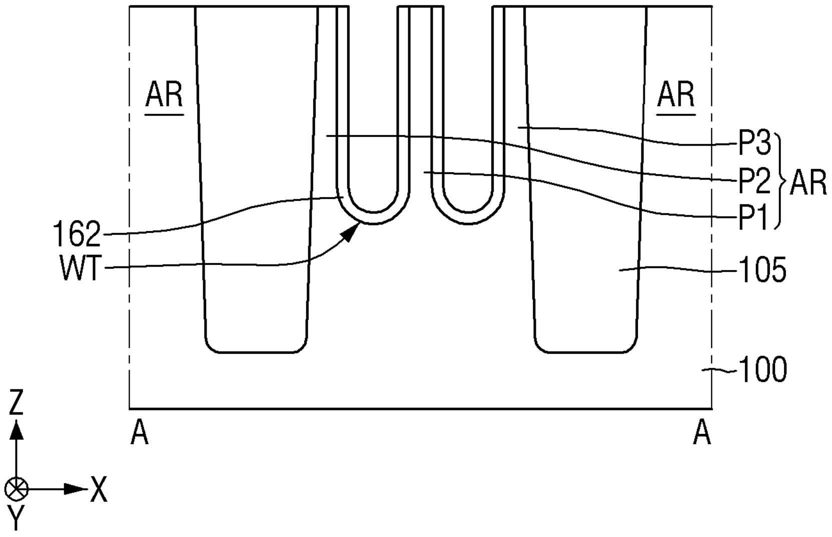
Figure 22:
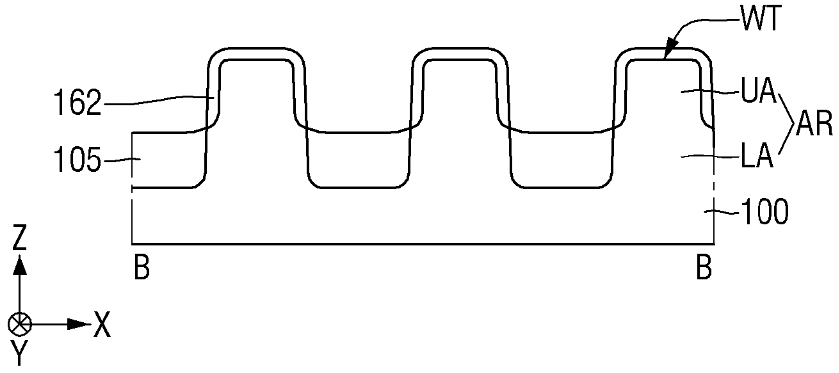

Referring to FIG. 20 to FIG. 22, the interfacial film 162 may be formed in the gate trench WT. For reference, FIG. 21 is a cross-sectional view taken along a line A-A of FIG. 20, and FIG. 22 is a cross-sectional view taken along a line B-B of FIG. 20.

The interfacial film 162 may be formed on a surface of the active area AR as not covered with the element isolation pattern 105. For example, as shown in FIGS. 21 and 22, the interfacial film 162 may extend along and conform to a profile of the active area AR defining the gate trench WT. Moreover, as the side surface of the gate trench WT protrudes toward the active area AR, the interfacial film 162 may extend along the side surface of the active area AR positioned inwardly of the side surface of the element isolation pattern 105. For example, the interfacial film 162 may extend along a side surface of the first portion P1, a side surface of the second portion P2, and a side surface of the third portion P3.

The interfacial film 162 may include an oxide of a material constituting the active area AR. For example, the interfacial film 162 may be an oxide film formed by oxidizing the surface of the active area AR exposed through the gate trench WT.

Figure 23:
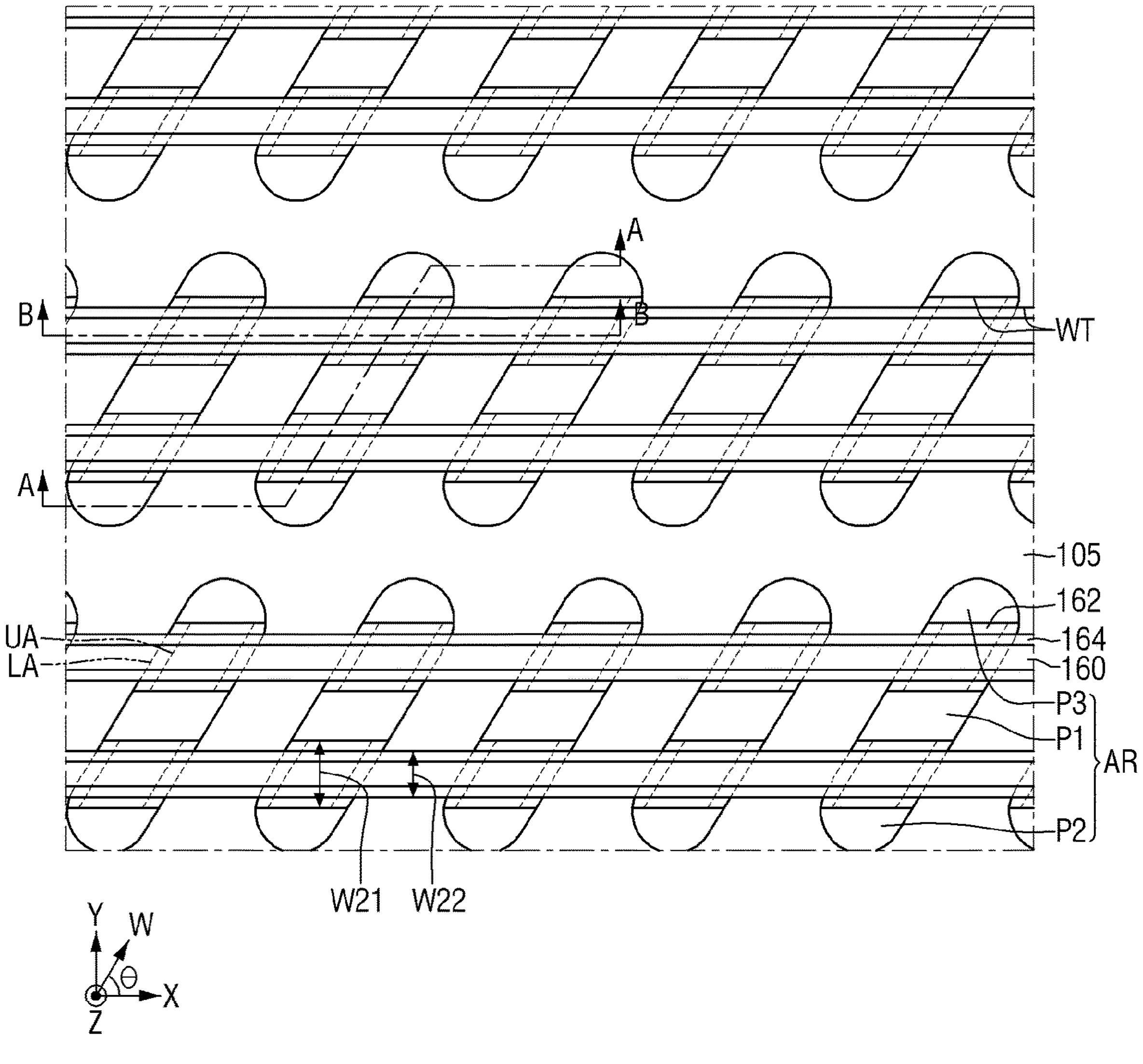
Figure 24:
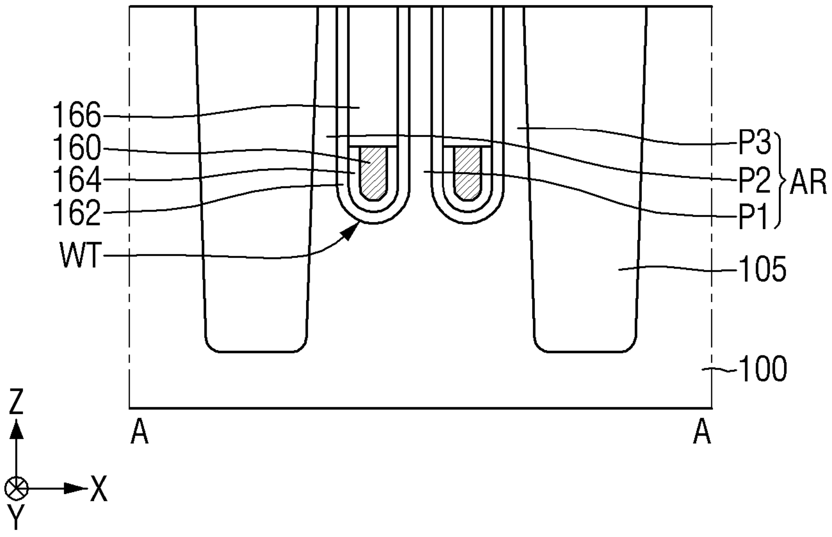
Figure 25:
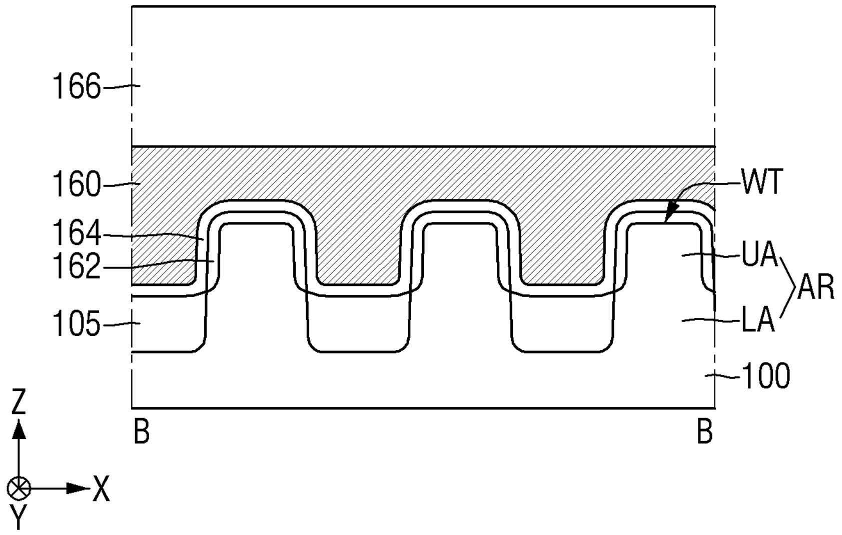

Referring to FIG. 23 to FIG. 25, the gate dielectric film 164, the second conductive pattern 160, and the second capping pattern 166 are formed in the gate trench WT. For reference, FIG. 24 is a cross-sectional view taken along a line A-A of FIG. 23, and FIG. 25 is a cross-sectional view taken along a line B-B of FIG. 23.

The gate dielectric film 164 may be formed on the interfacial film 162 and the element isolation pattern 105. For example, as shown in FIG. 23, the gate dielectric film 164 may extend along and conform to the profiles of the side surface of the interfacial film 162 and the side surface of the element isolation pattern 105. Moreover, as shown in FIGS. 24 and 25, the gate dielectric film 164 may extend along and conform to the profiles of the side and upper surfaces of the interfacial film 162 and the upper surface of the element isolation pattern 105.

The second conductive pattern 160 may be formed on the gate dielectric film 164. The second conductive pattern 160 may fill at least a portion of the gate trench WT. In some embodiments, the second conductive pattern 160 may be spaced apart from the upper surface of the substrate 100 so as to be in or fill a lower portion of the gate trench WT.

The second capping pattern 166 may be formed on the second conductive pattern 160. The second capping pattern 166 may extend along the upper surface of the second conductive pattern 160. For example, the second capping pattern 166 may be in and may fill an upper portion of the gate trench WT remaining after the interfacial film 162, the gate dielectric film 164, and the second conductive pattern 160 are formed in the gate trench WT.

Figure 26:
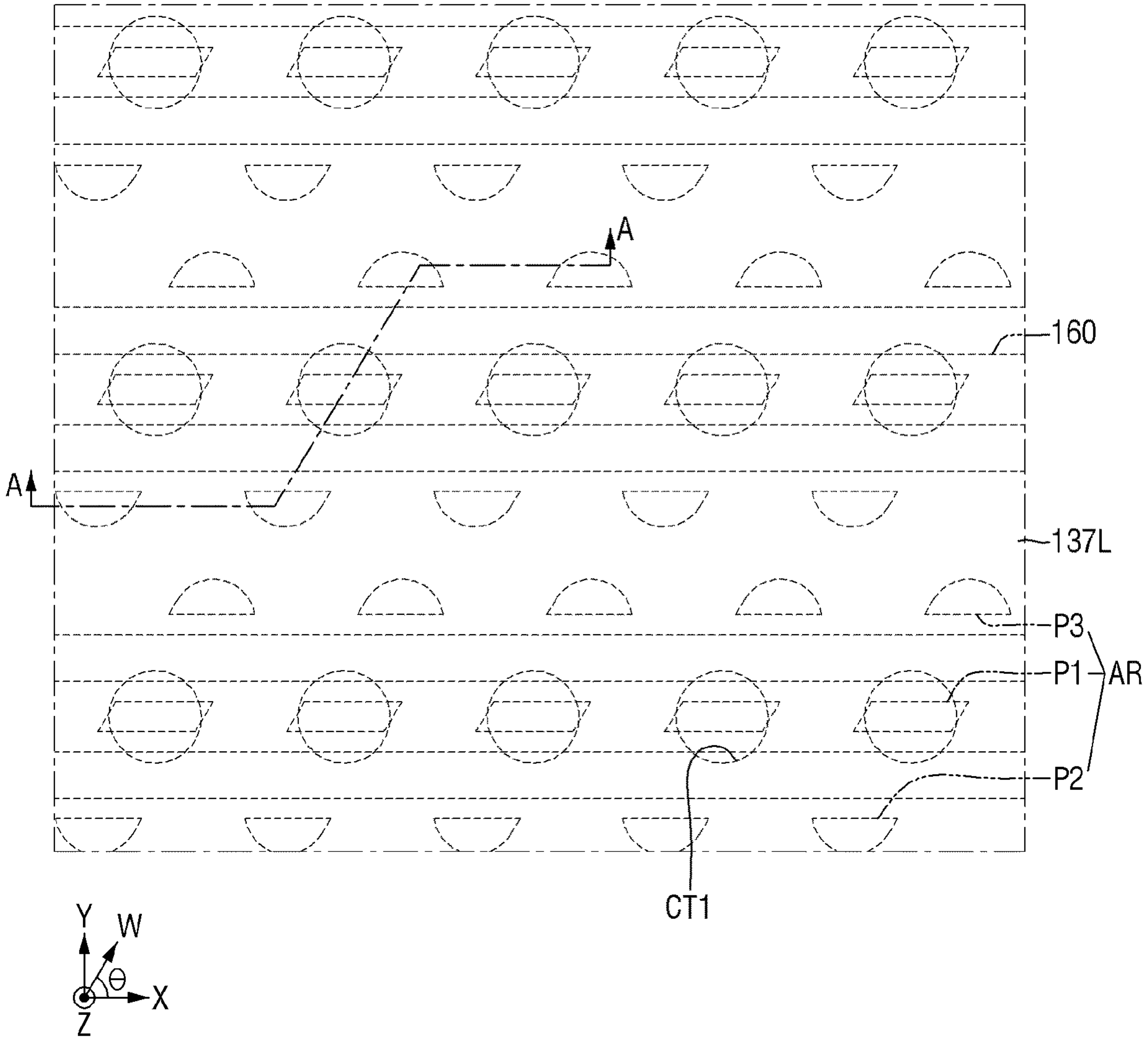
Figure 27:
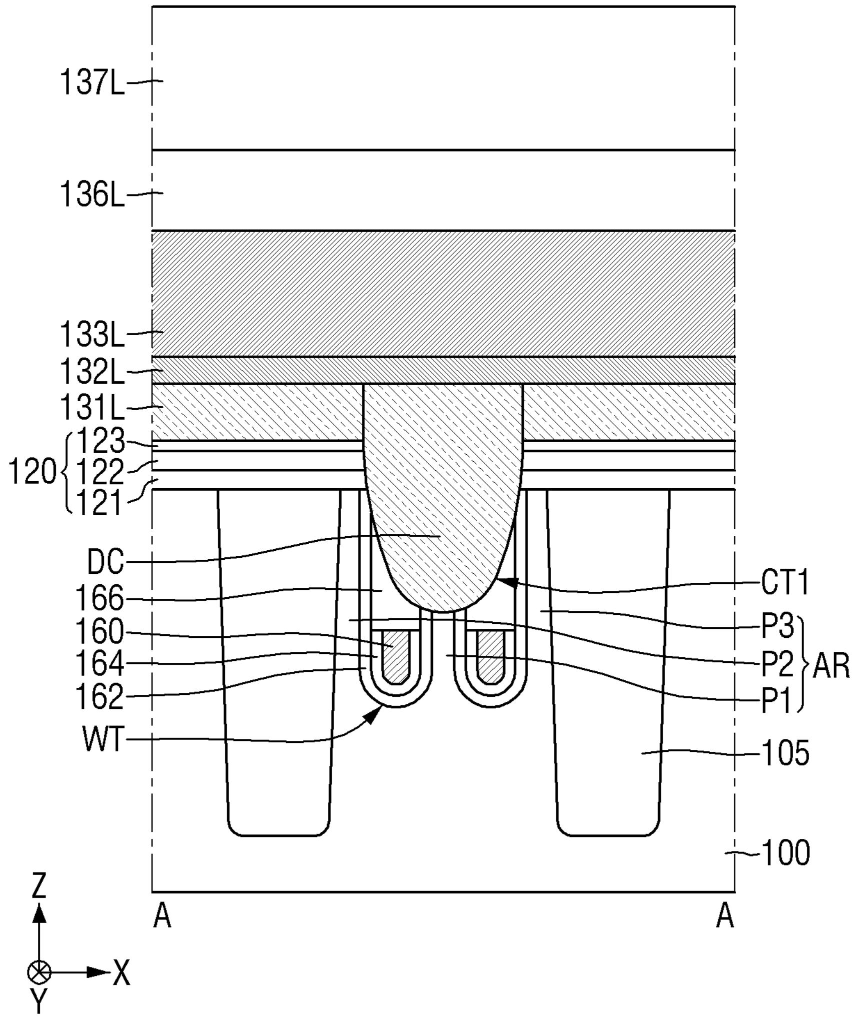

Referring to FIG. 26 and FIG. 27, the base insulating film 120, a first conductive film 131L, the direct contact DC, a second conductive film 132L, a third conductive film 133L, a first capping film 136L and a second capping film 137L may be formed on the substrate 100. For reference, FIG. 27 is a cross-sectional view taken along a line A-A of FIG. 26.

For example, the first insulating film 121, the second insulating film 122, the third insulating film 123, and the first conductive film 131L may be sequentially formed on the substrate 100 and the element isolation pattern 105. Subsequently, the first contact trench CT1 exposing the first portion P1 of the active area AR may be formed. Subsequently, the direct contact DC may be formed in the first contact trench CT1. Subsequently, the second conductive film 132L, the third conductive film 133L, the first capping film 136L, and the second capping film 137L may be sequentially formed on the first conductive film 131L and the direct contact DC.

Figure 28:
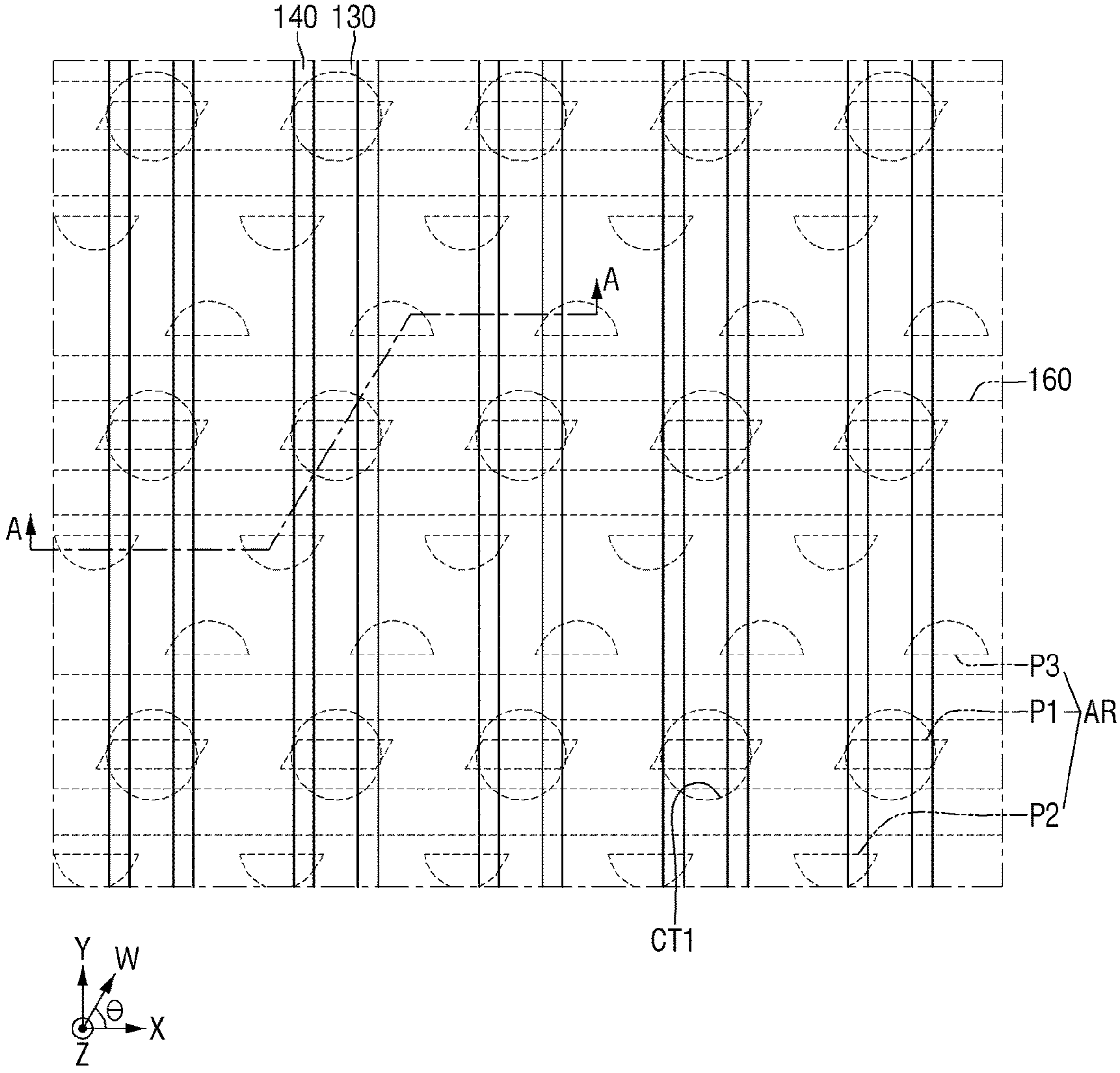
Figure 29:
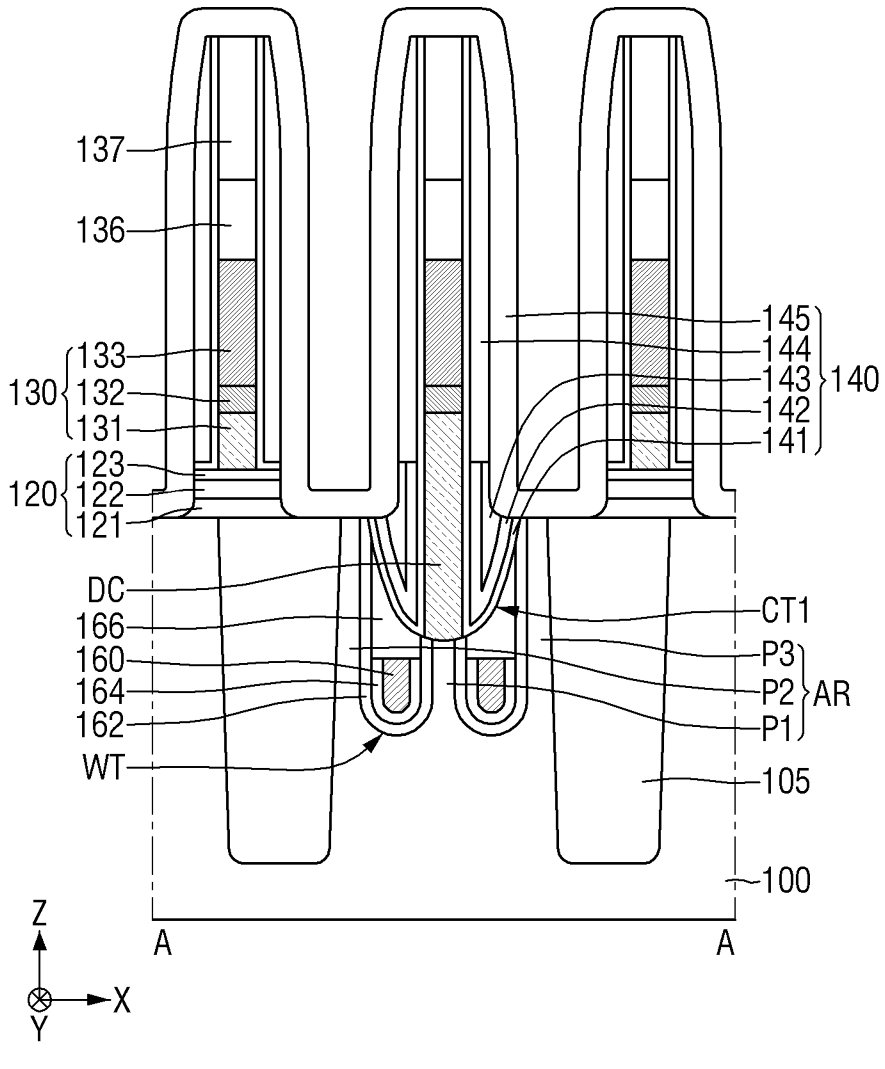

Referring to FIG. 28 and FIG. 29, the first conductive pattern 130, the first capping pattern 136 and 137, and the spacer structure 140 may be formed. For reference, FIG. 29 is a cross-sectional view taken along a line A-A of FIG. 28.

For example, a patterning process on the first conductive film 131L, the direct contact DC, the second conductive film 132L, the third conductive film 133L, the first capping film 136L, and the second capping film 137L in FIG. 26 and FIG. 27 may be performed. Thus, the first conductive pattern 130 and the first capping pattern 136 and 137 extending in an elongate manner in the first direction Y may be formed on the substrate 100.

Subsequently, the spacer structure 140 may be formed on the side surface of the first conductive pattern 130 and the side surface of the first capping pattern 136 and 137. For example, the base spacer 141 extending on and conforming to the first conductive pattern 130 and the first capping pattern 136 and 137 may be formed. Subsequently, the first lower spacer 142 and the second lower spacer 143 may be sequentially formed on the base spacer 141 in the first contact trench CT1. Then, the first side spacer 144 extending along and conforming to the base spacer 141, the first lower spacer 142, and the second lower spacer 143 may be formed. Subsequently, an etching process may be performed to remove a portion of the base insulating film 120 interposed between adjacent ones of the plurality of first conductive patterns 130. In the etching process, a portion of the first side spacer 144 extending along an outer side surface of the base spacer 141 may not be removed but may remain. Subsequently, the second side spacer 145 may be formed so as to extend on and conform to the first side spacer 144.

Figure 30:
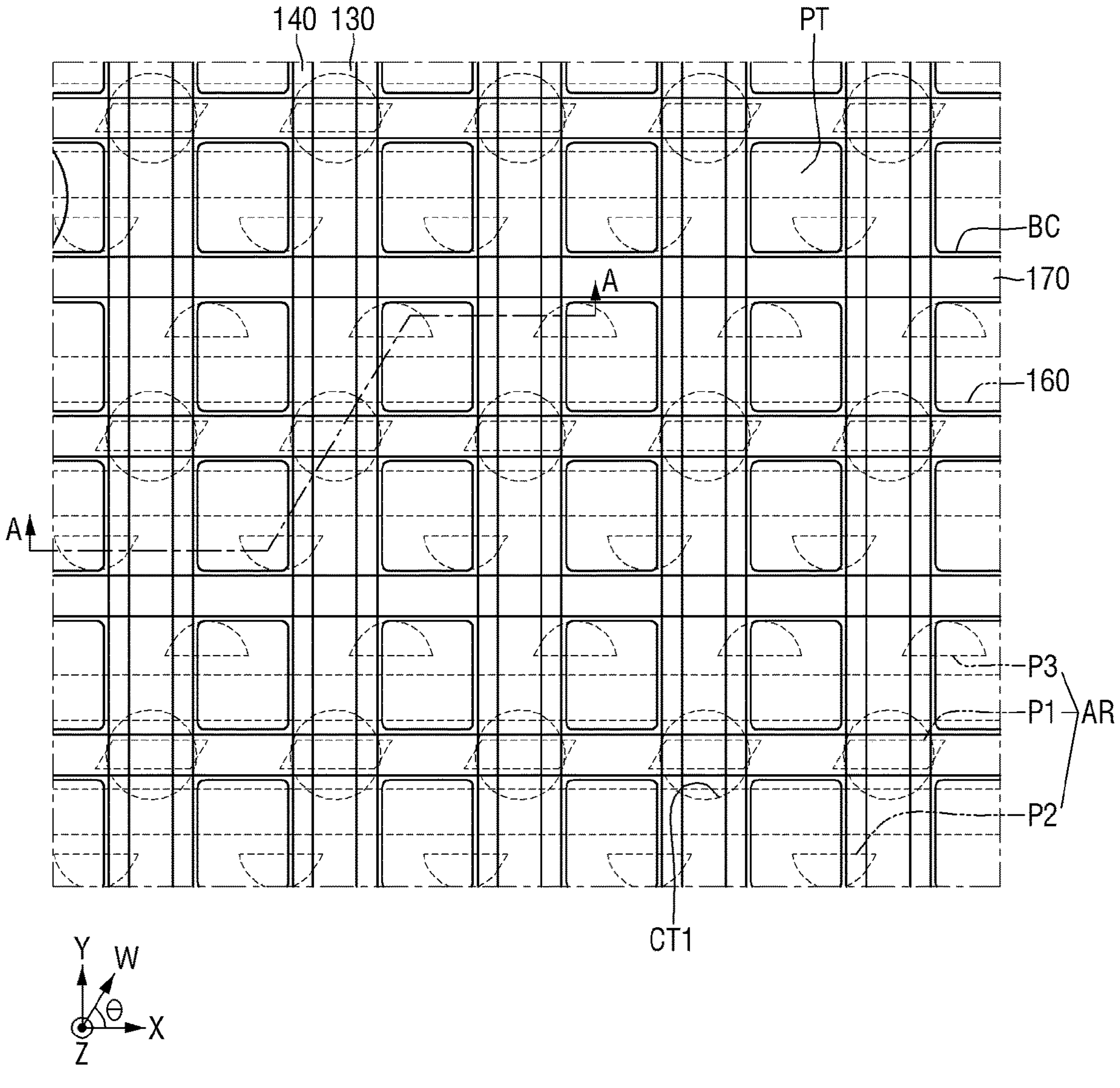
Figure 31:
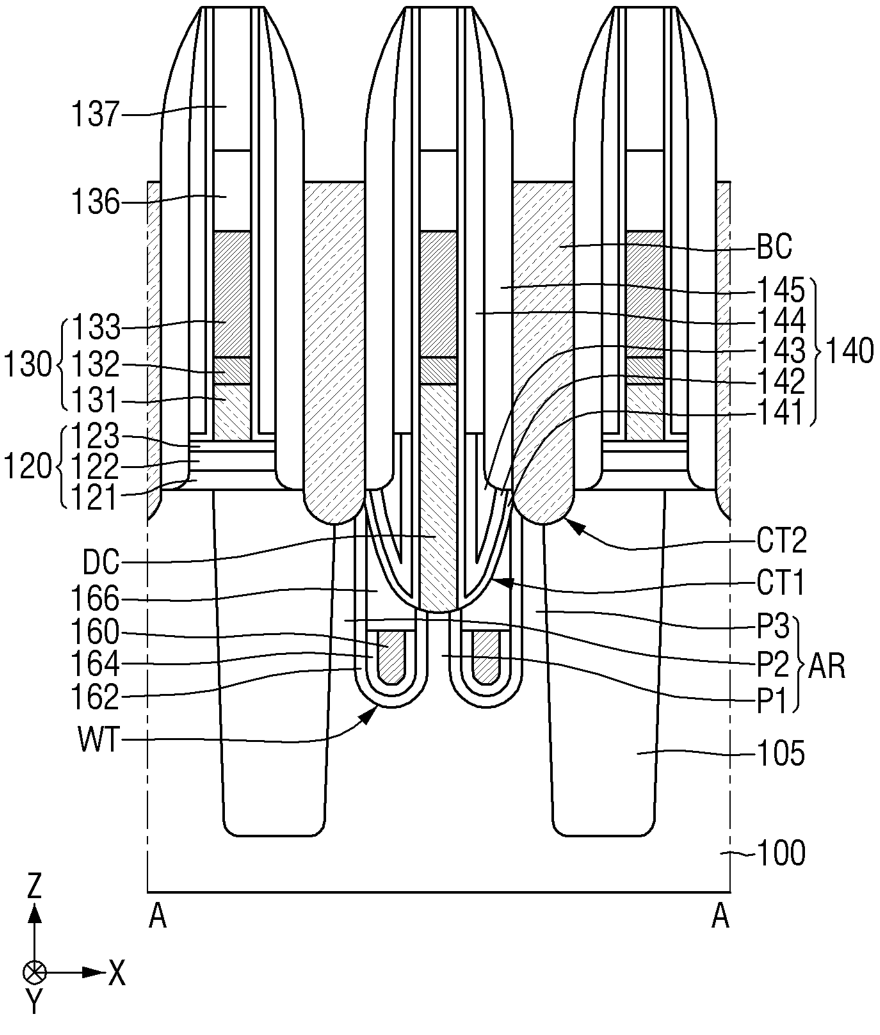

Referring to FIG. 30 and FIG. 31, the insulating fence 170 and the buried contact BC may be formed. For reference, FIG. 31 is a cross-sectional view taken along a line A-A of FIG. 30.

For example, the insulating fence 170 extending in an elongate manner in the second direction X may be formed on the base insulating film 120. The insulating fence 170 may intersect the first conductive pattern 130 or the spacer structure 140.

Then, the buried contact BC may be formed on the side surface of the first conductive pattern 130 and the side surface of the insulating fence 170. For example, the second contact trench CT2 extending through the base insulating film 120 so as to expose the second portion P2 or the third portion P3 of the active area AR may be formed between adjacent ones of the plurality of first conductive patterns 130 and between adjacent ones of the plurality of insulating fences 170. The buried contact BC may be formed in the second contact trench CT2. In some embodiments, a vertical level of the uppermost surface of the buried contact BC may be lower than that of the uppermost surface of the first capping pattern 138 and 139.

Figure 32:
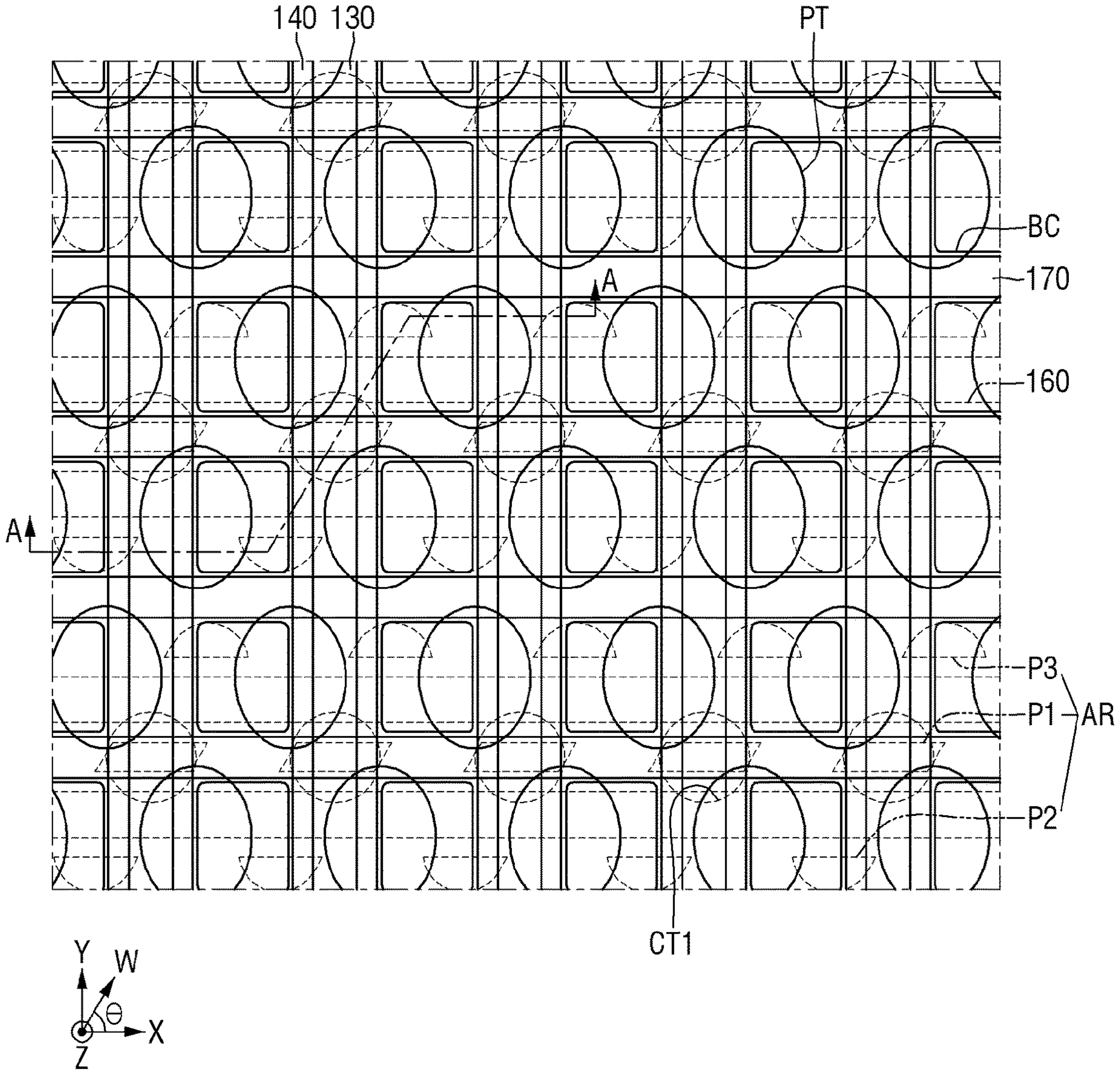
Figure 33:
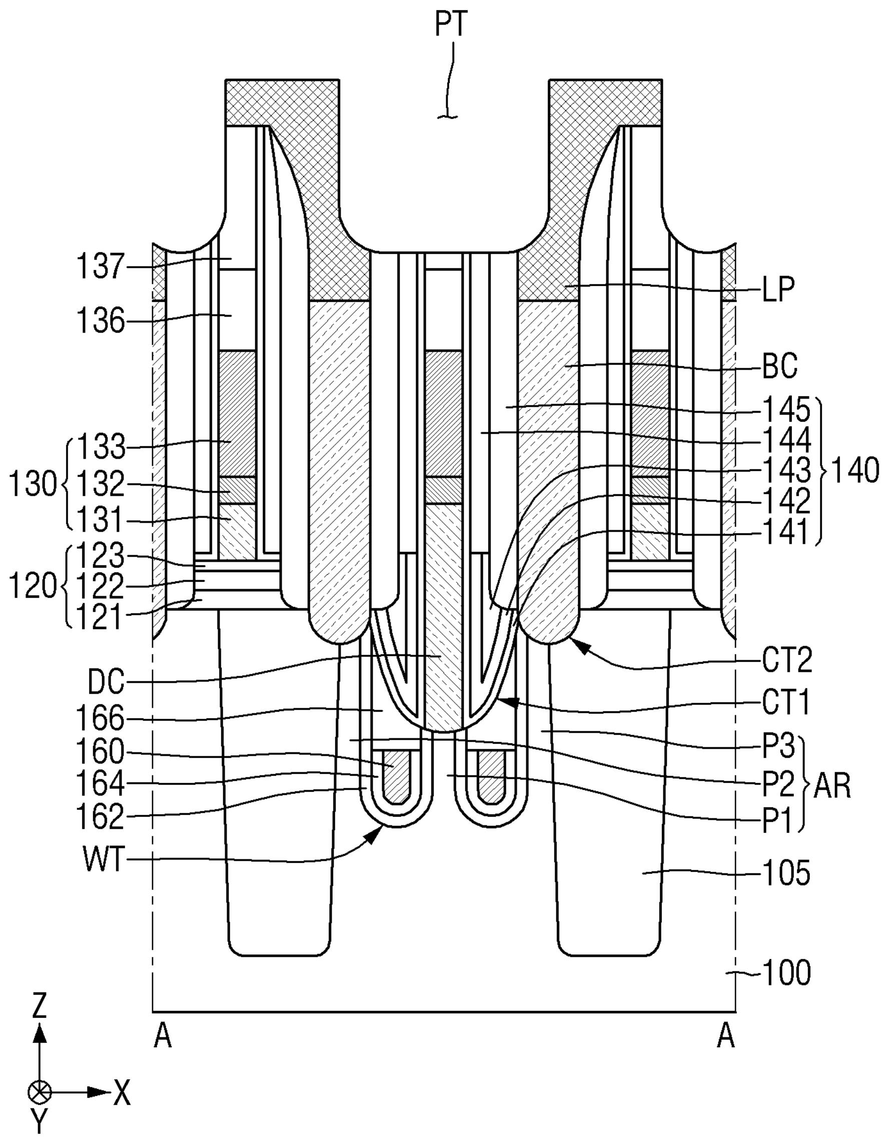

Referring to FIG. 32 and FIG. 33, the landing pad LP may be formed. For reference, FIG. 33 is a cross-sectional view taken along a line A-A of FIG. 32.

The landing pad LP may be formed on the buried contact BC. The landing pad LP may be arranged so as to overlap the buried contact BC in the fourth direction Z. The landing pads LP may form a plurality of isolated areas spaced apart from each other on the plurality of first capping patterns 136 and 137, the plurality of spacer structures 140, and the plurality of insulating fences 170. For example, a pad trench PT isolating the upper portions of the landing pads LP from each other may be formed.

Subsequently, referring to FIGS. 1 to 3, the isolation insulating film 180 and the capacitor structure 190 may be formed on the landing pad LP. In this way, the semiconductor memory device as described above using FIGS. 1 to 4 may be manufactured.

As the semiconductor device is highly integrated, a line width of a pattern included in the semiconductor device may be increasingly smaller, and the difficulty of the process is also increasing. For example, in a semiconductor memory device including a so-called buried channel array transistor (BCAT) in which a gate electrode is buried in a trench of a substrate, as a spacing between gate electrodes gradually decreases, it may become difficult to form a trench having a line width (a critical dimension; CD) and a depth as required.

In this regard, in a semiconductor device according to some embodiments, the line width and the depth of the gate trench WT may be easily controlled using the recess process on the element isolation pattern 105 and/or the active area AR. Specifically, as described above, the width of the portion of the gate trench WT in the element isolation pattern 105 and a protruding height of the upper pattern UA may be controlled via the first recess process on the element isolation pattern 105. Moreover, the width of the portion of the gate trench WT in the active area AR and the width of the upper pattern UA may be controlled via the second recess process on the active area AR. Thus, the second conductive patterns 160 may be arranged so as to be spaced from each other by a smaller spacing. Thus, the semiconductor memory device with the improved integration may be provided.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor memory device comprising:

a substrate;

an element isolation pattern defining an active area in the substrate;

a first conductive pattern on the substrate and the element isolation pattern, and extending in a first direction, wherein the first conductive pattern is connected to a first portion of the active area;

a capacitor structure on the substrate and the element isolation pattern and connected to a second portion of the active area;

a gate trench defined in the substrate and the element isolation pattern and extending in a second direction that intersects the first direction, the gate trench extending across the active area in an area between the first portion and the second portion thereof; and a second conductive pattern in the gate trench and extending in the second direction, wherein a first maximum trench width of a portion of the gate trench in the active area is greater than a second maximum trench width of a portion of the gate trench in the element isolation pattern.

2. The semiconductor memory device of claim 1, wherein the area between the first portion and the second portion of the active area includes a lower pattern covered with the element isolation pattern, and an upper pattern on the lower pattern and free from coverage by the element isolation pattern, wherein a first pattern width of the upper pattern is smaller than a second pattern width of the lower pattern.

3. The semiconductor memory device of claim 2, wherein a portion of the upper pattern adjacent to the first portion and the second portion overlaps the element isolation pattern in the second direction.

4. The semiconductor memory device of claim 1, further comprising:

an interfacial film in the gate trench and extending along a side surface of the first portion and a side surface of the second portion; and a gate dielectric film between the interfacial film and the second conductive pattern and extending along the interfacial film and the element isolation pattern.

5. The semiconductor memory device of claim 4, wherein the interfacial film includes an oxide of a material of the active area.

6. The semiconductor memory device of claim 4, further comprising a capping pattern in the gate trench and extending along an upper surface of the second conductive pattern.

7. The semiconductor memory device of claim 1, wherein the element isolation pattern defines a plurality of active areas in the substrate, wherein the plurality of active areas are arranged in a lattice structure in the first direction and the second direction.

8. The semiconductor memory device of claim 1, wherein a first gate width of a portion of the second conductive pattern in the active area is greater than a second gate width of a portion of the second conductive pattern in the element isolation pattern.

9. The semiconductor memory device of claim 1, wherein a first gate width of a portion of the second conductive pattern in the active area is smaller than a second gate width of a portion of the second conductive pattern in the element isolation pattern.

10. A semiconductor memory device comprising:

a substrate;

an element isolation pattern defining an active area in the substrate;

a first conductive pattern on the substrate and the element isolation pattern, wherein the first conductive pattern extends in a first direction, and wherein the first conductive pattern is connected to a first portion of the active area;

a capacitor structure on the substrate and the element isolation pattern, the capacitor structure connected to a second portion of the active area;

a gate trench defined in the substrate and the element isolation pattern and extending in a second direction that intersects the first direction, wherein the gate trench extends across the active area in an area between the first portion and the second portion thereof; and a second conductive pattern in the gate trench and extending in the second direction, wherein the area between the first portion and the second portion of the active area includes a lower pattern covered with the element isolation pattern, and an upper pattern disposed on the lower pattern and free from coverage by the element isolation pattern, wherein a first pattern width of the upper pattern is smaller than a second pattern width of the lower pattern, wherein a portion of the upper pattern adjacent to the first portion and the second portion overlaps the element isolation pattern in the second direction.

11. The semiconductor memory device of claim 10, wherein a first trench width of a portion of the gate trench in the active area is greater than a second trench width of a portion of the gate trench in the element isolation pattern.

12. The semiconductor memory device of claim 10, further comprising:

an interfacial film in the gate trench and extending along a side surface of the first portion, a side surface of the second portion, and a side surface and an upper surface of the upper pattern; and a gate dielectric film in the gate trench and extending along an upper surface of the element isolation pattern, and a side surface and an upper surface of the interfacial film.

13. The semiconductor memory device of claim 12, wherein the interfacial film is not interposed between the element isolation pattern and the gate dielectric film, and wherein the interfacial film includes an oxide of a material of the active area.

14. The semiconductor memory device of claim 12, further comprising a capping pattern in the gate trench and extending along an upper surface of the second conductive pattern, wherein a portion of the interfacial film is interposed between the active area and the capping pattern.

15. The semiconductor memory device of claim 10, wherein the element isolation pattern defines each of a plurality of active areas in the substrate, wherein the plurality of active areas are arranged in a lattice structure in the first direction and the second direction.

16. A semiconductor memory device comprising:

a substrate;

an element isolation pattern defining an active area in the substrate;

a first conductive pattern on the substrate and the element isolation pattern and extending in a first direction;

a direct contact connecting the active area and the first conductive pattern to each other;

a spacer structure extending along a side surface of the first conductive pattern;

a buried contact on a side surface of the spacer structure and connected to the active area;

a capacitor structure on the buried contact and connected to the buried contact;

a gate trench defined in the substrate and the element isolation pattern and extending in a second direction that intersects the first direction, wherein the gate trench extends across the active area in an area between the direct contact and the buried contact; and a second conductive pattern in the gate trench and extending in the second direction, wherein a first maximum width of a portion of the gate trench in the active area is greater than a second maximum width of a portion of the gate trench in the element isolation pattern.

17. The semiconductor memory device of claim 16, further comprising a gate dielectric film interposed between the active area and the second conductive pattern.

18. The semiconductor memory device of claim 17, further comprising an interfacial film interposed between the active area and the gate dielectric film, wherein the interfacial film includes an oxide of a material of the active area.

19. The semiconductor memory device of claim 16, wherein the element isolation pattern defines each of a plurality of active areas in the substrate, wherein the plurality of active areas are arranged in a lattice structure in the first direction and the second direction.

20. The semiconductor memory device of claim 16, further comprising:

a base metal film between the substrate and the first conductive pattern;

a base semiconductor film between the substrate and the base metal film, and including a semiconductor material doped with impurities; and a base silicide film between the base semiconductor film and the base metal film, and including a metal silicide material, wherein the direct contact directly contacts the base metal film.

* * * * *